us006222361B1

United States Patent
Shimano et al.

(10) Patent No.: US 6,222,361 B1
(45) Date of Patent: Apr. 24, 2001

(54) POSITION DETECTING DEVICE USING VARYING WIDTH MAGNETO-RESISTIVE EFFECT SENSOR

(75) Inventors: Tadahiko Shimano; Masaaki Kusumi, both of Kanagawa (JP)

(73) Assignee: Sony Precision Technology Inc., Tokyo (JP)

( * ) Notice: Subject to any disclaimer, the term of this patent is extended or adjusted under 35 U.S.C. 154(b) by 0 days.

(21) Appl. No.: 09/204,205

(22) Filed: Dec. 2, 1998

(30) Foreign Application Priority Data

Dec. 4, 1997 (JP) .................................................. 9-334434

(51) Int. Cl.[7] .............................. G01B 7/14; G01R 33/09; H01L 43/08
(52) U.S. Cl. ............................... 324/207.21; 324/207.24; 324/252; 338/32 R
(58) Field of Search ................... 324/207.21, 207.24, 324/252; 338/32 R; 360/313, 316, 327

(56) References Cited

U.S. PATENT DOCUMENTS

| | | | |
|---|---|---|---|
| 3,335,384 | * | 8/1967 | Weiss ............................. 338/32 R X |
| 3,336,558 | * | 8/1967 | Wright . | |
| 3,691,502 | * | 9/1972 | Kataoka ..................... 324/207.21 X |
| 4,048,557 | * | 9/1977 | Chen ................................ 324/252 X |
| 5,351,028 | * | 9/1994 | Krahn ......................... 324/207.21 X |

* cited by examiner

*Primary Examiner*—Gerard R. Strecker
(74) *Attorney, Agent, or Firm*—Jay H. Maioli

(57) ABSTRACT

A magneto-resistive effect sensor capable of outputting a sufficient output of optimum characteristics even if a magnetized surface of a magnetized material is curved, arcuately- or polygonally-shaped. On the magneto-resistive effect sensor 3, plural magnetically sensitive portions 12a to 12d of the same shape are formed and arrayed parallel to one another, while being electrically connected in series to permit the current i to flow through the electrically connected magnetically sensitive portions. The magnetically sensitive portion 12a is made up of a mid portion 15a having a width w1 and ends having a width w2. A signal magnetic field of different strengths is applied from the magnetized material along the current flowing direction. The widths w1 and w2 differ with the strengths of the applied signal magnetic field and are of a ratio such that w1:w2=2:3. The strength of the signal magnetic field is high to give high resistance in a narrow-width area of the magnetically sensitive portion 12a, while being low to give low resistance in a broad-width portion of the magnetically sensitive portion 12a, such that the magneto-resistive effect sensor in its entirety can develop a sufficient output with an optimum S/N ratio.

5 Claims, 24 Drawing Sheets

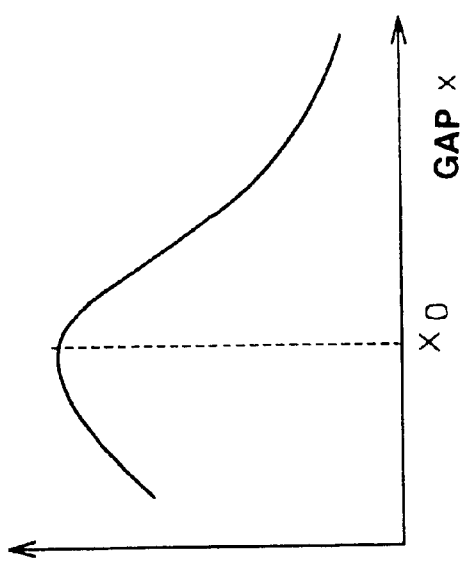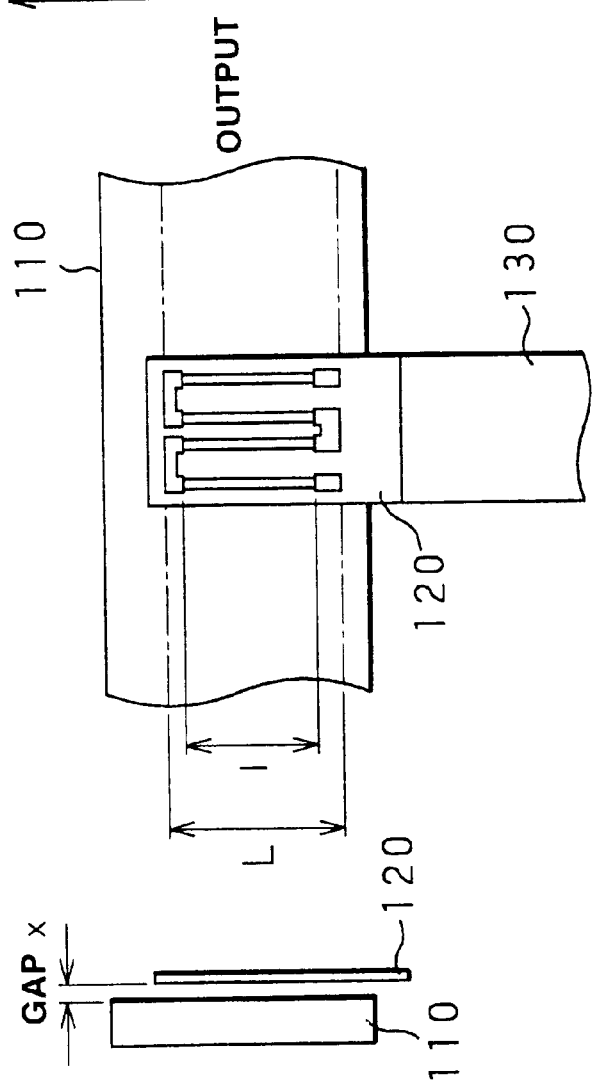
FIG.6C  FIG.6B  FIG.6A

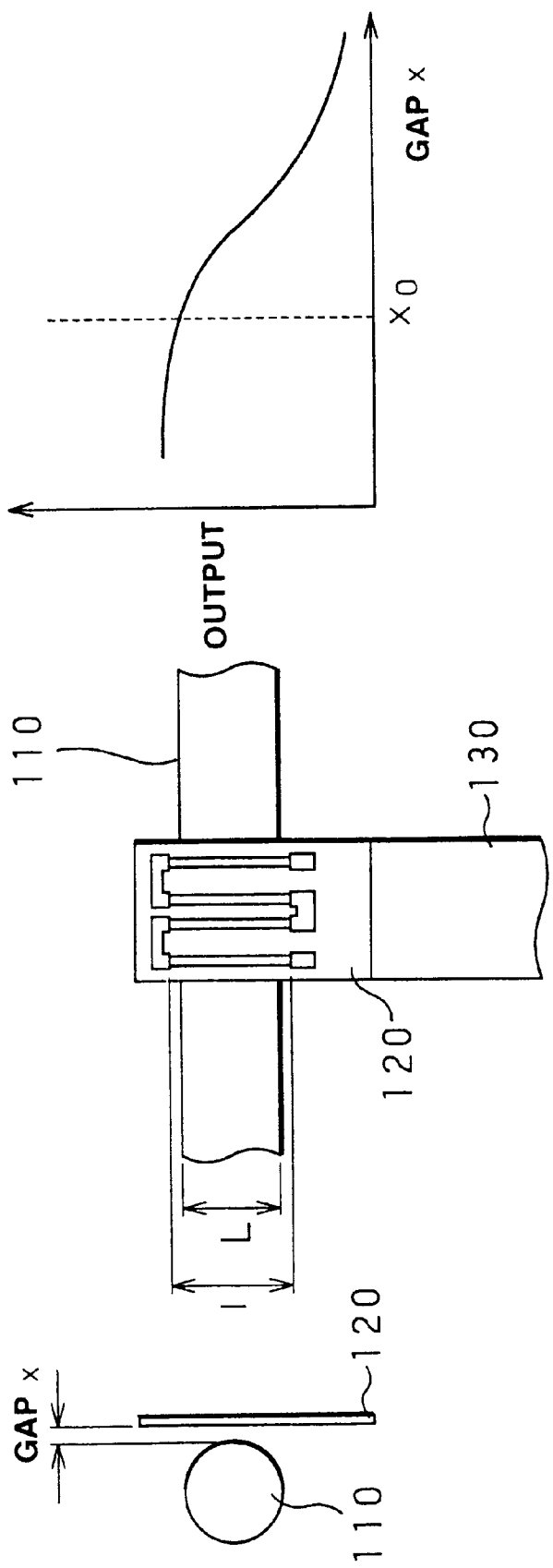

POSITION DETECTING DEVICE USING VARYING WIDTH MAGNETO-RESISTIVE EFFECT SENSOR

BACKGROUND OF THE INVENTION

1. Field of the Invention

This invention relates to a magneto-resistive effect sensor having its magnetically sensitive area formed of a material exhibiting the magneto-resistive effect and to a position detection device employing this magneto-resistive effect sensor.

2. Description of the Related Art

There has so far been known a magnetic position detection device for detecting the rotational position of an rotating object or the position of an object performing a linear movement.

FIG. 1 shows an example of this type of the magnetic position detection device.

A position detection device 100 has an elongated magnetic scale 110, and a magneto-resistive effect sensor (MR sensor) 120, having its magnetically sensitive portion formed by a thin film. One of the magnetic scale 110 or the MR sensor 120 is mounted on a moving object, with the other being mounted on a reference unit.

On the magnetic scale 110, alternate N and S poles are formed along its length as periodic position signals at a recording pitch λ.

The MR sensor 120 is held on, for example, a holding mechanism, not shown, and is arranged facing a magnetized surface of the magnetic scale 110 carrying the position signals of the magnetic scale 110. This MR sensor 120 is moved in translation along the position signals of the magnetic scale 110 as it is kept at a pre-set gap distance from the magnetized surface of the magnetic scale 110. The MR sensor 120, thus translated, detects the position signals to convert the detected position signals into electrical signals which are outputted to outside over a flexible cable 130 etc.

With the above-described position detection device 100, the relative position between the magnetic scale 110 and the MR sensor 120 can be detected at an interval P equal to one-half the recording pitch λ to enable detection of the moving position of an object.

Meanwhile, a permanent magnet can be mounted along with an MR sensor for scale signals and an MR sensor for a point-of-origin signals on a head holder in order to apply biasing magnetization across the MR sensor for scale signals and the MR sensor for a point-of-origin signals.

The MR sensor 120 will be explained in further detail.

The MR sensor 120 is comprised of a substrate 121 of a non-magnetic material, such as glass, and a strip-shaped magnetically sensitive portion 122 formed thereon by depositing a ferromagnetic material, such as Fe—Ni or Ni—Co, as shown in FIG. 2. This magnetically sensitive portion 122 demonstrates a magneto-resistive effect in which, when the dc current flows therethrough longitudinally, its resistance becomes maximum and minimum for the minimum strength of the signal magnetic field impressed in a direction perpendicular to the current flowing through the magnetically sensitive portion 122 and which is parallel to the film surface and for the maximum strength of the signal magnetic field impressed in a direction perpendicular to the current flowing through the magnetically sensitive portion 122 and which is parallel to the film surface, respectively.

On this MR sensor 120, there are formed first to fourth magnetically sensitive portions 122a to 122d in a direction parallel to its longitudinal direction as the magnetically sensitive portion 122. The first and second magnetically sensitive portions 122a, 122b are arranged at an interval therebetween equal to a detection pitch P for the position signals of the magnetic scale 110. Similarly, the third and fourth magnetically sensitive portions 122c, 122d are also arranged at an interval therebetween equal to the detection pitch P for the position signals of the magnetic scale 110. The interval between the second and third magnetically sensitive portions 122b and 122c is set to P/2.

The magnetically sensitive portions 122a, 122b are electrically connected in series with each other by an electrode 123a, while the magnetically sensitive portions 122c, 122d are electrically connected in series with each other by an electrode 123b. The end of the magnetically sensitive portion 122b not connected to the electrode 123a is connected by an electrode 124 in series with the end of the magnetically sensitive portion 122c not connected to the electrode 123b. The end of the magnetically sensitive portion 122a not connected to the electrode 123a is grounded via electrode 125a, while the end of the magnetically sensitive portion 122d not connected to the electrode 123b is connected via an electrode 125b to a constant voltage source. By interconnecting the magnetically sensitive portions 122a to 122d in this manner, an equivalent circuit as shown in FIG. 3 is constituted in the MR sensor 120 to permit a sensor output to be detected at the electrode 124.

The operation of the MR sensor 120 is hereinafter explained.

The above-described MR sensor 120 is moved relative to the position signals on the magnetic scale 110 responsive to the object movement. If, for example, the magnetically sensitive portions 122a, 122b of the MR sensor 120 are moved to over the N and S poles of the position signals, as shown in FIG. 4, the magnetically sensitive portions 122a, 122b exhibit a maximum resistance value because the strength of the magnetic field of stray magnetic flux component in the plane of the magnetically sensitive surface is zero. At this time, the magnetically sensitive portions 122c, 122d exhibit the minimum resistance value because the maximum magnetic field of stray magnetic flux component in the plane of the magnetically sensitive surface is applied. The result is that a maximum potential is produced at the electrode 124.

If conversely the magnetically sensitive portions 122c, 122d of the MR sensor 120 are moved over the N and S poles of the position signals, as shown in FIG. 5, the magnetically sensitive portions 122c, 122d exhibit a maximum resistance value because the strength of the magnetic field of stray magnetic flux component in the plane of the magnetically sensitive surface is zero. At this time, the magnetically sensitive portions 122a, 122b exhibit the minimum resistance value because the maximum magnetic field of the component in the plane of the magnetically sensitive surface is applied. The result is that minimum potential is produced at the electrode 124.

It is thus possible with the MR sensor 120 to output at the electrode 124 a signal generated in conformity to a period equal to one-half the recording pitch λ of the position signals, by movement of the MR sensor 120 on the magnetic scale 110, to detect the position of movement of an object.

In the magnetic position detection device 100, the MR sensor 120 and the magnetic scale 110 are adapted to perform relative movement with a pre-set spatial gap therebetween because in general the MR sensor 120 and the magnetic scale 110 cannot be brought in use into contact with each other. The gap length between the MR sensor 120 or the magnetic scale 110 affects the output sensitivity of the MR sensor 120, in much the same way as the recording pitch λ of the position signals of the magnetic scale 110 or the strength of the magnetic field applied from the position signal to the MR sensor 120.

FIGS. 6C shows output characteristics of the MR sensor 120 with respect to changes in the gap length x between the MR sensor 120 and the magnetic scale 110. It is noted that these output characteristics are derived from resistance changes in the MR sensor 120.

The output characteristics shown here are those for a case in which the MR sensor 120 is provided facing a surface of a flat-plate-shaped magnetic scale 110 having position signals recorded thereon, as shown in FIG. 6A, and in which the width L of the recording signals of the magnetic scale 110 is sufficiently longer than the length l along the longitudinal direction of the magnetically sensitive portion 122 of the MR sensor 120, as shown in FIG. 6B. That is, the characteristics shown here are those obtained when the signal magnetic field of the same intensity is applied across the entire area of the magnetically sensitive portion 122 of the MR sensor 120.

The output characteristics of the MR sensor 120 shown here are those in which a peak output value can be detected at a pre-set gap length x0, as shown in FIG. 6c. Thus, with the position detection device 100, an optimum detection output can be obtained by setting the gap length between the MR sensor 120 and the magnetic scale 110 at the time of relative movement therebetween so as to be close to this gap length x0.

However, there are cases wherein the magnetic scale 110 cannot be designed in the flat plate shape, but has to be shaped as a round-rod- or polygonally-shaped bar, given the shape of an article under measurement.

FIG. 7c shows output characteristics of the MR sensor 120 with respect to changes in the gap length x between the MR sensor 120 and the magnetic scale 110 in case the magnetic scale 110 is a round bar.

Specifically, FIG. 7c shows the characteristics in case the MR sensor 120 faces the surface of the magnetic scale 110 in the form of a round bar on which are magnetized the position signals of the magnetic scale 110, as shown in FIG. 7A, and in case a width L of the recording signals recorded on the magnetic scale 110, corresponding to the diameter of the magnetic scale 110, is shorter than the length l along the longitudinal direction of the magnetically sensitive portion 122 of the MR sensor 120, as shown in FIG. 7B. That is, FIG. 7c shows characteristics in case signal magnetic fields of different strengths are applied along the length of the magnetically sensitive portion 122 of the MR sensor 120. The gap length x is represented as the shortest distance between the magnetic scale 110 and the MR sensor 120.

In this case, the output characteristics of the MR sensor 120 are such that the peak output value cannot be detected, as shown in FIG. 7c, with the obtainable output of the sensor being of the order of 50 to 60% of the output obtained with the flat-plate-shaped magnetic scale.

That is, if the MR sensor is in the form of a flat plate, while the magnetic scale is arcuately-shaped, polygonally shaped or formed as a round bar, it is difficult to realize optimum output characteristics. The reason is that, with the MR sensor 120, it is not possible to efficiently detect the stray magnetic flux from the magnetic scale 110 on which is magnetized the position information.

FIG. 8 shows the relative position between the round-bar-shaped magnetic scale 110 and the magnetically sensitive portion 122 of the MR sensor 120.

It is now assumed that the radius r of the round-bar-shaped magnetic scale 110 is 1 mm, the length l along the longitudinal direction of the magnetically sensitive portion 122 of the MR sensor 120 is 2 mm and the shortest gap length x1 between the magnetically sensitive portion 122 and the magnetic scale 110 (the gap length at a longitudinally center position Q1 of the magnetically sensitive portion 122) is 120 μm.

In this case, a gap length x2 at a position Q2 spaced 0.5 mm from the center of the magnetically sensitive portion 122 and a gap length x3 at a position Q3 spaced 1 mm from the center of the magnetically sensitive portion 122, are found as follows:

$$r = l/2 = 1$$
$$x1 = 0.12$$
$$X_2 = -r + \sqrt{(r+X_1)^2 + (l/4)^2} = 0.266$$
$$X_3 = -r + \sqrt{(r+X_1)^2 + (l/2)^2} = 0.501 \tag{1}$$

It is seen from this that the gap length x2 of the position Q2 is longer than the gap length x1 at the center position Q1 of the magnetically sensitive portion 122 and that, if the strength of the magnetic field generated by the magnetic scale 110 is uniform, the amount of the stray magnetic flux reaching the position Q2 is smaller than the stray magnetic flux reaching the position Q1. Thus, the rate of change of resistance at the position 2 is of the order only of 10% of that at the position Q1. Moreover, from the position Q2 on, there scarcely occurs the change in resistance.

Thus, with the use of the round-bar-shaped magnetic scale 110, it is only a portion near its center that substantially undergoes the magneto-resistive effect, while its end portion demonstrates the function only of a resistor, thus worsening the efficiency.

It is proposed in, for example, Japanese Laying-Open Patent H-8-285509, to set the longitudinal length of the magnetically sensitive portion 122 so as to be shorter than the diameter of the magnetic scale 110 to improve output characteristics of the MR sensor 120 in case of using the round-bar-shaped magnetic scale 110. However, although a sufficient output can be developed if the center position of the magnetically sensitive portion 122 completely coincides with the center of the magnetic scale 110, the output is lowered significantly if the relative position is shifted even to the slightest extent. In this case, it is difficult to realize a stable output. Moreover, the resistance of the device is lowered in an undesirable manner as an electrical device, to render assembling of the magnetic scale device difficult.

SUMMARY OF THE INVENTION

It is therefore an object of the present invention to provide a magneto-resistive effect sensor in which a sufficient output with optimum characteristics can be developed even if the magnetized surface of a magnetized member is curved, arcuate or polygonal.

It is another object of the present invention to provide a position detection device employing the above magneto-resistive effect sensor in which the magnetized surface of a magnetized member is curved, arcuate or polygonal.

In one aspect, the present invention provides a magneto-resistive effect sensor in which a magnetically sensitive area is formed by a material exhibiting the magneto-resistive effect, and in which the magnetically sensitive area has a portion with different widths in a direction perpendicular to the current flowing direction.

For example, with the present magneto-resistive effect sensor, the width of the magnetically sensitive area differs with the strength of an applied signal magnetic field.

In another aspect, the present invention provides a position detection device including a magnetized material having a signal magnetic field affording the position information recorded thereon, and a magneto-resistive effect sensor arranged for relative movement with respect to the recording direction of the signal magnetic field recorded on the magnetized material. The magneto-resistive effect sensor has a magnetically sensitive area formed of a material exhibiting the magneto-resistive effect. A signal magnetic field has different strengths of the magnetic field depending on the current flowing direction being applied from the magnetized material to the magnetically sensitive area of the magneto-resistive effect sensor. The magnetically sensitive area has portion(s) with different widths in a direction perpendicular to the current flowing direction.

With the present position detection device, the width of the magnetically sensitive area of the magneto-resistive effect sensor differs with the strength of the signal magnetic field applied from the magnetized material.

With the magneto-resistive effect sensor of the present invention, the magnetically sensitive area has portions of different widths, whereby an optimum output can be developed even if the signal magnetic field of different strengths is applied from the magnetized material.

With the magneto-resistive effect sensor, a sufficient output with optimum characteristics can be developed by the magnetically sensitive area being of different widths depending on the strength of the applied signal magnetic field, even if the magnetized area is curved, arcuately or polygonally-shaped. Also, with the present magneto-resistive effect sensor, the distance between the magnetically sensitive portion and the magnetized portion can be maintained at a larger value, thus assuring facilitated assembling and improved reliability.

Also, with the position detection device of the present invention, the width of the magnetically sensitive area differs with the strength of the signal magnetic field applied from the magnetized material.

Thus, with the present magneto-resistive effect sensor, a sufficient output with optimum characteristics can be developed, even if the magnetized area is curved, arcuately or polygonally-shaped. Also, with the present magneto-resistive effect sensor, the distance between the magnetically sensitive portion and the magnetized portion can be maintained at a larger value to assure facilitated assembling and improved reliability.

Also, with the position detection device according to the present invention, the magnetically sensitive area of the magneto-resistive effect sensor has a width differing with the strength of the signal magnetic field applied from the magnetized material.

Thus, with the present position detection device, a sufficient output with optimum characteristics can be developed, even if the magnetized area is curved, arcuately or polygonally-shaped. Also, with the present magneto-resistive effect sensor, the distance between the magnetically sensitive portion and the magnetized portion can be maintained at a larger value to assure facilitated assembling and improved reliability.

BRIEF DESCRIPTION OF THE DRAWINGS

FIG. 6A illustrates the gap length x between an MR sensor and a flat-plate-shaped magnetic scale.

FIG. 6B illustrates the length l in the longitudinal direction of a magnetically sensitive portion of the MR sensor and the width L of the recording signal of the magnetic scale.

FIG. 6C is a graph showing output characteristics of a magneto-resistive effect sensor employing a flat-plate-shaped magnetic scale.

FIG. 7A illustrates the gap length x between an MR sensor and a round-rod-shaped magnetic scale.

FIG. 7B illustrates the length l in the longitudinal direction of a magnetically sensitive portion of the MR sensor and the width L of the recording signal of the magnetic scale.

FIG. 7C is a graph showing output characteristics of a magneto-resistive effect sensor employing a round-rod-shaped magnetic scale.

DESCRIPTION OF THE PREFERRED EMBODIMENTS

Figure 1:
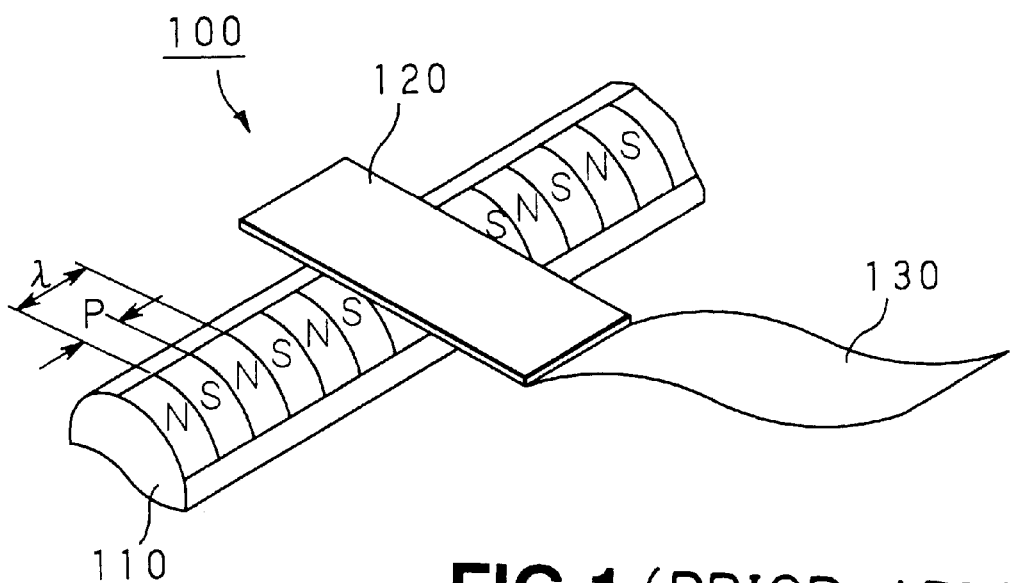
FIG. 1 illustrates a conventional position detection device.
Figure 2:
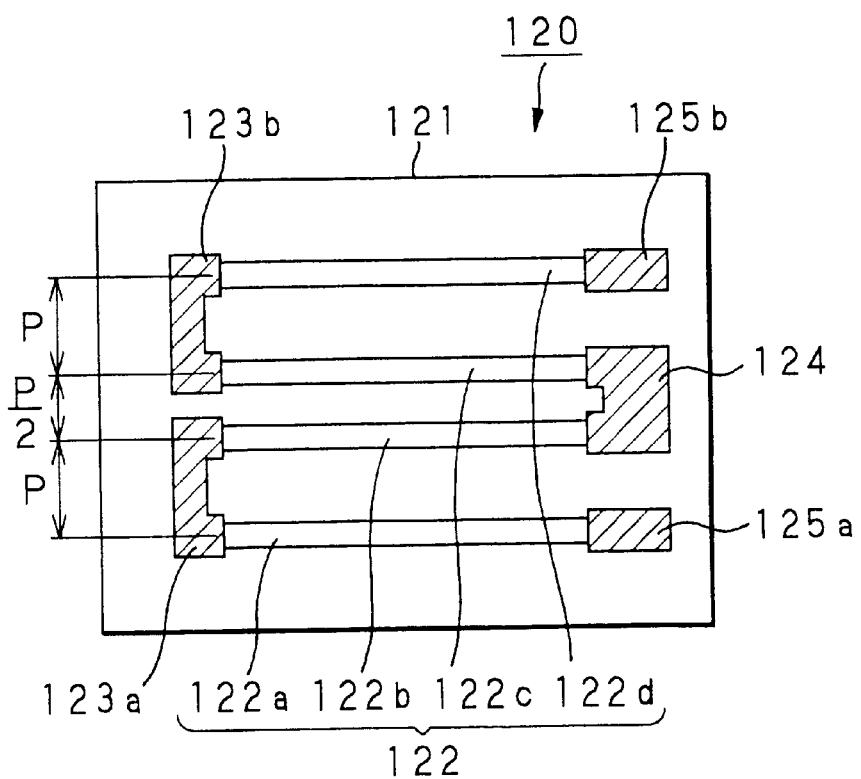
FIG. 2 illustrates a conventional magneto-resistive effect sensor.
Figure 3:
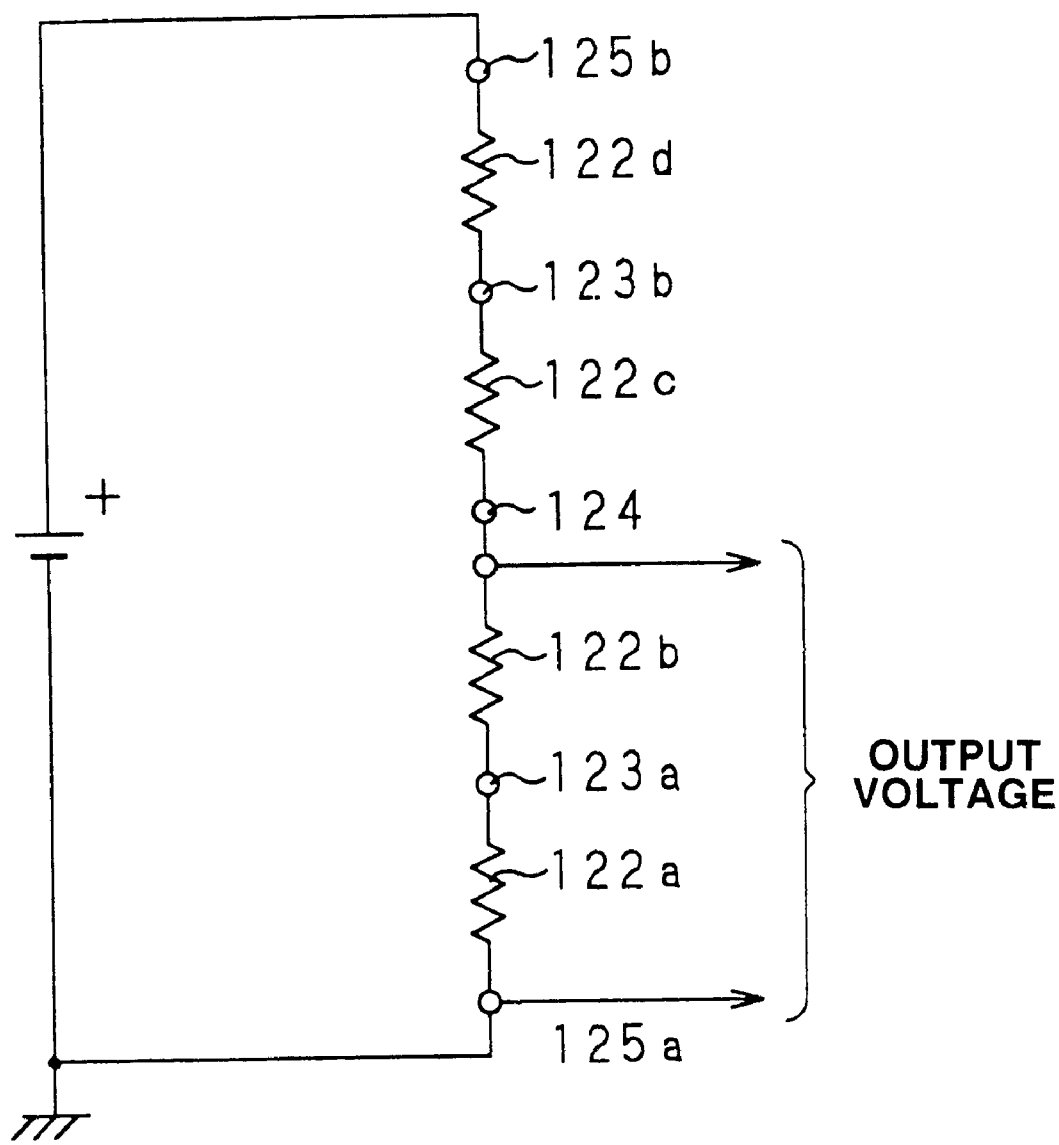
FIG. 3 is an equivalent circuit diagram of the conventional magneto-resistive effect sensor.
Figure 4:
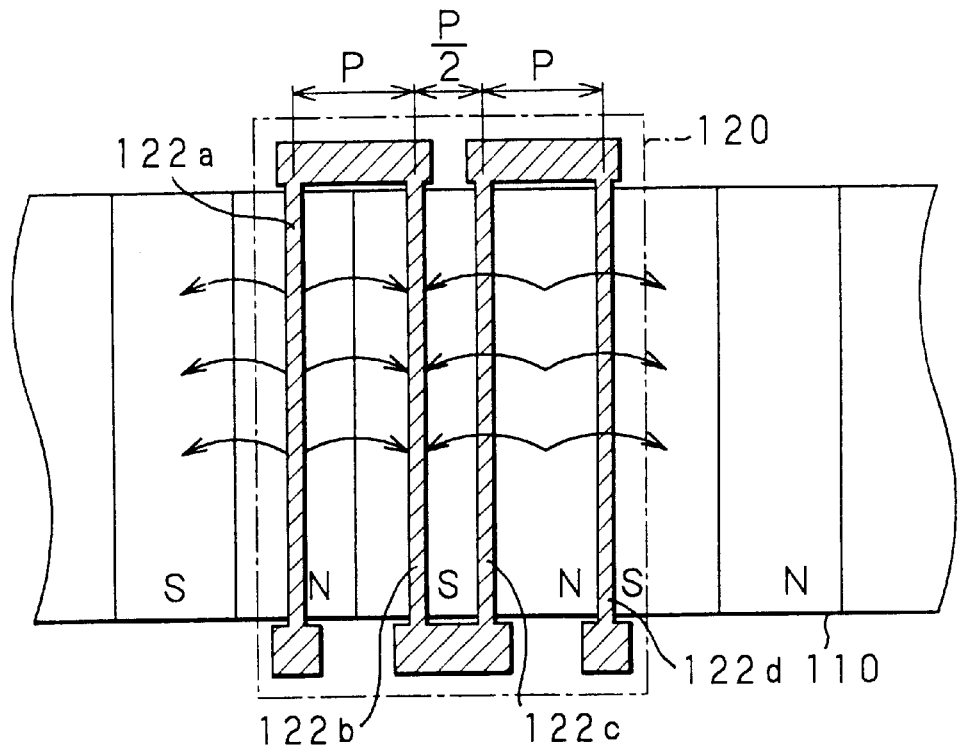
FIG. 4 illustrates the operation of the conventional magneto-resistive effect sensor.
Figure 5:
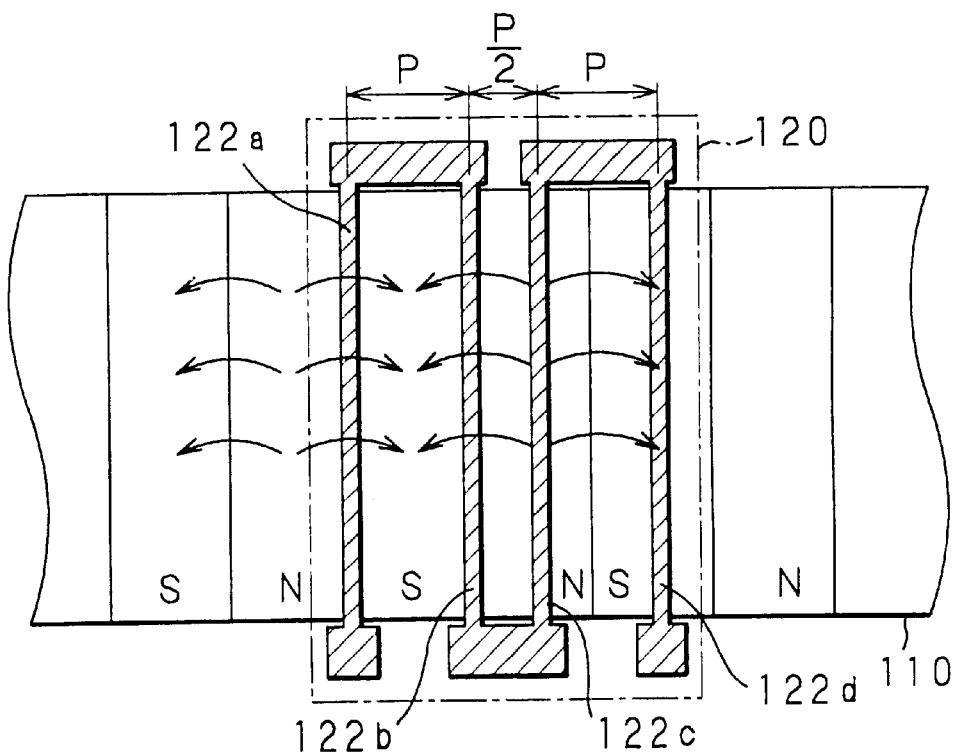
FIG. 5 similarly illustrates the operation of the conventional magneto-resistive effect sensor.
Figure 8:
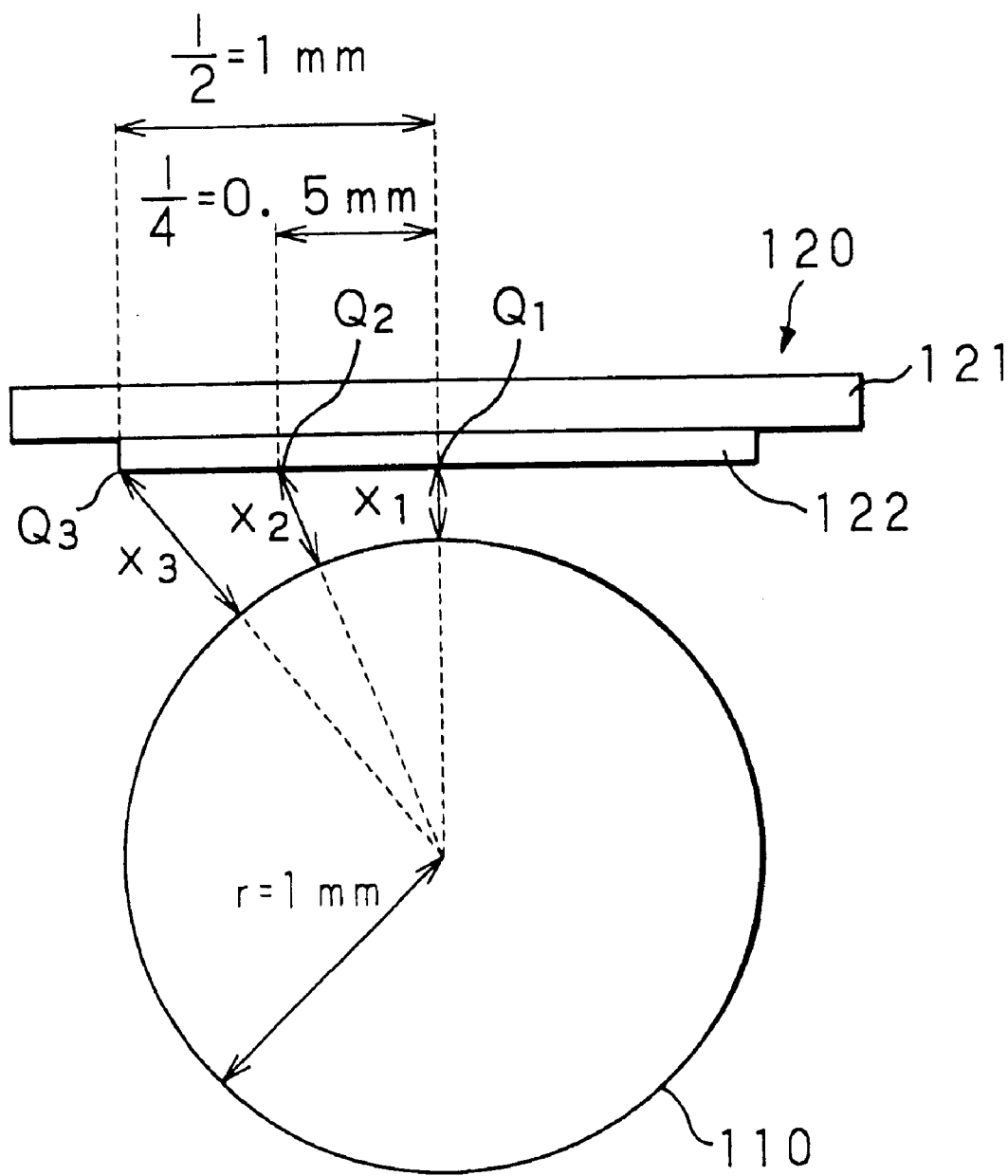
FIG. 8 illustrates the relative position between the round-rod-shaped magnetic scale and the conventional magneto-resistive effect sensor.

Referring to the drawings, a position detection device of a first embodiment of the present invention will be explained in detail.

Figure 9:
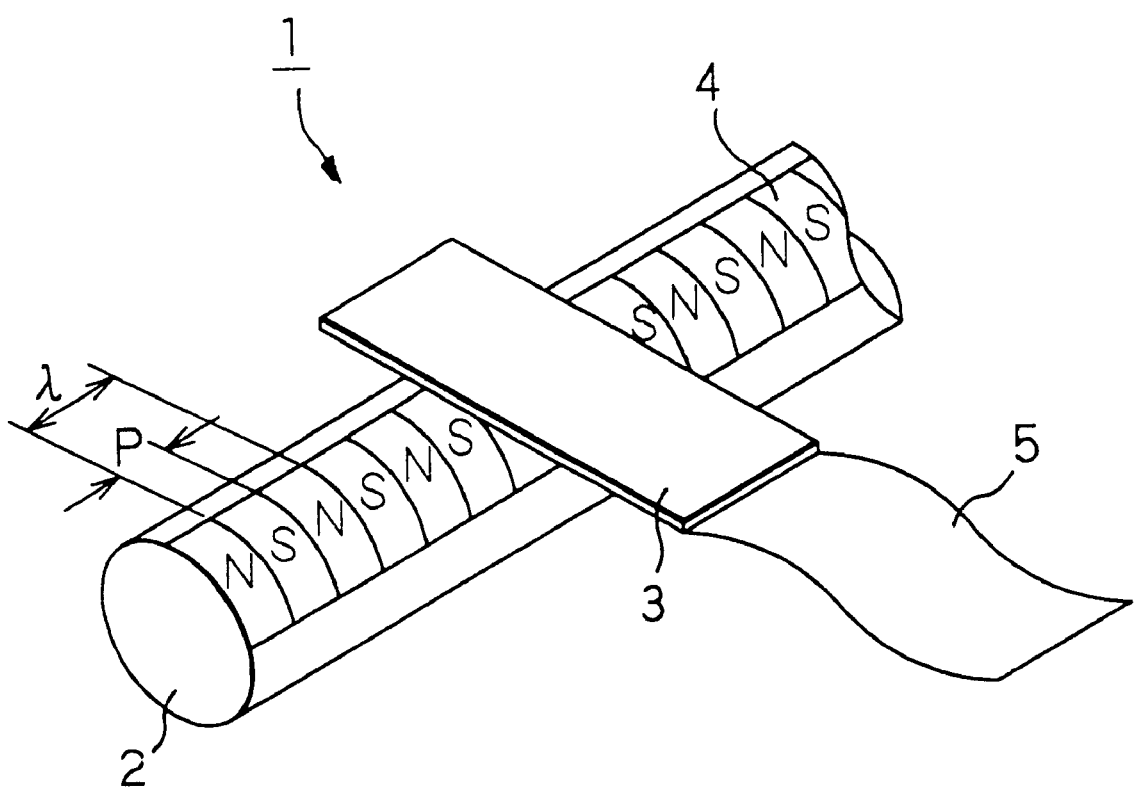
FIG. 9 illustrates a position detection device according to a first embodiment of the present invention.

A position detection device 1, according to the first embodiment, shown in FIG. 9, is adapted for detecting the position of an object performing a linear movement.

The position detection device 1 includes a round-rod-shaped magnetic scale 2 and a magneto-resistive effect sensor (MR sensor) 3 on a substrate of which is formed a magnetically sensitive portion as a thin film. One of the magnetic scale 2 or the MR sensor 3 is mounted on a moving object, with the other being mounted on a reference unit.

On the magnetic scale 2, alternate N and S poles are formed along its length as periodic position signals 4 at a recording pitch $\lambda$.

The MR sensor 3 is held on, for example, a holding mechanism, not shown, and is moved in translation along the position signals 4 of the magnetic scale 2 as it is kept at a pre-set spatial gap distance from the magnetized surface of the magnetic scale 2. The MR sensor 3, thus translated, detects the position signals to convert the detected position signals into electrical signals which are outputted to outside over a flexible cable 5 etc.

By having the above-described structure, the position detection device 1 can detect the movement position of an object by detecting the relative positions of the magnetic scale 2 and the MR sensor 3 as a signal having a detection pitch P equal to one-half the recording pitch $\lambda$.

The MR sensor 3 is hereinafter explained.

Figure 10:
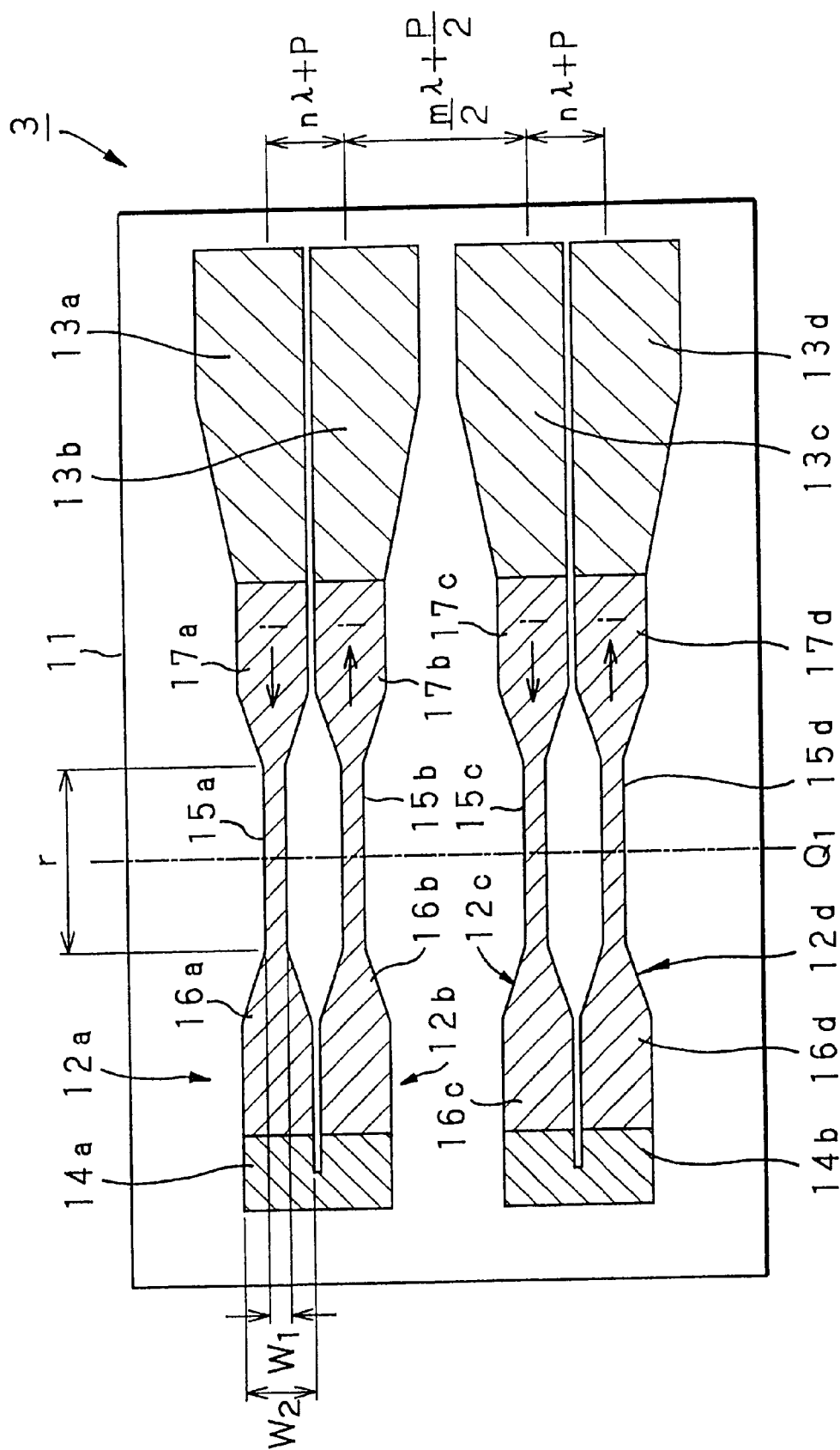
FIG. 10 illustrates the magneto-resistive effect sensor of the position detection device according to a first embodiment of the present invention.

Referring to FIG. 10, the MR sensor 3 includes a substrate 11 of a non-magnetic material, such as glass, and a magnetically sensitive portion 12 (12a to 12d) formed on a surface thereof facing the surface of the magnetic scale 2 having the position signals 4 magnetized thereon. The magnetically sensitive portion 12 is flown through by the dc current along its longitudinal direction. The MR sensor 3 is moved relative to the magnetic scale 2 in the perpendicular to the direction of the dc current flow, that is in a direction perpendicular to the longitudinal direction of the magnetically sensitive portion 12 and which is parallel to the film surface of the magnetically sensitive portion 12, whereby the magnetically sensitive portion 12 detects the stray magnetic flux of the magnetic scale 2. The MR sensor 3 demonstrates the magneto-resistive effect in which, when the dc current flows through the magnetically sensitive portion 12 longitudinally, the resistance of the MR sensor 3 becomes maximum and minimum for the minimum strength of the signal magnetic field impressed in a direction perpendicular to the current flowing through the magnetically sensitive portion 12 and which is parallel to the film surface, and for the maximum strength of the signal magnetic field impressed in a direction perpendicular to the current flowing through the magnetically sensitive portion 12 and which is parallel to the film surface, respectively.

On this MR sensor 3, there are formed first to fourth magnetically sensitive portions 12a to 12d of the same profile, as the magnetically sensitive portion 12, in a direction parallel to its longitudinal direction. The first and second magnetically sensitive portions 12a, 12b are arranged at an interval therebetween equal to (n$\lambda$+P) where $\lambda$ is the recording pitch of the position signals 4 of the magnetic scale 2. Simlarly, the third and fourth magnetically sensitive portions 12c, 12d are also arranged at an interval therebetween equal to (n$\lambda$+P). The interval between the second and third magnetically sensitive portions 12b and 12c is set to m/2$\lambda$+P/2, where n and m are integers.

Figure 11:
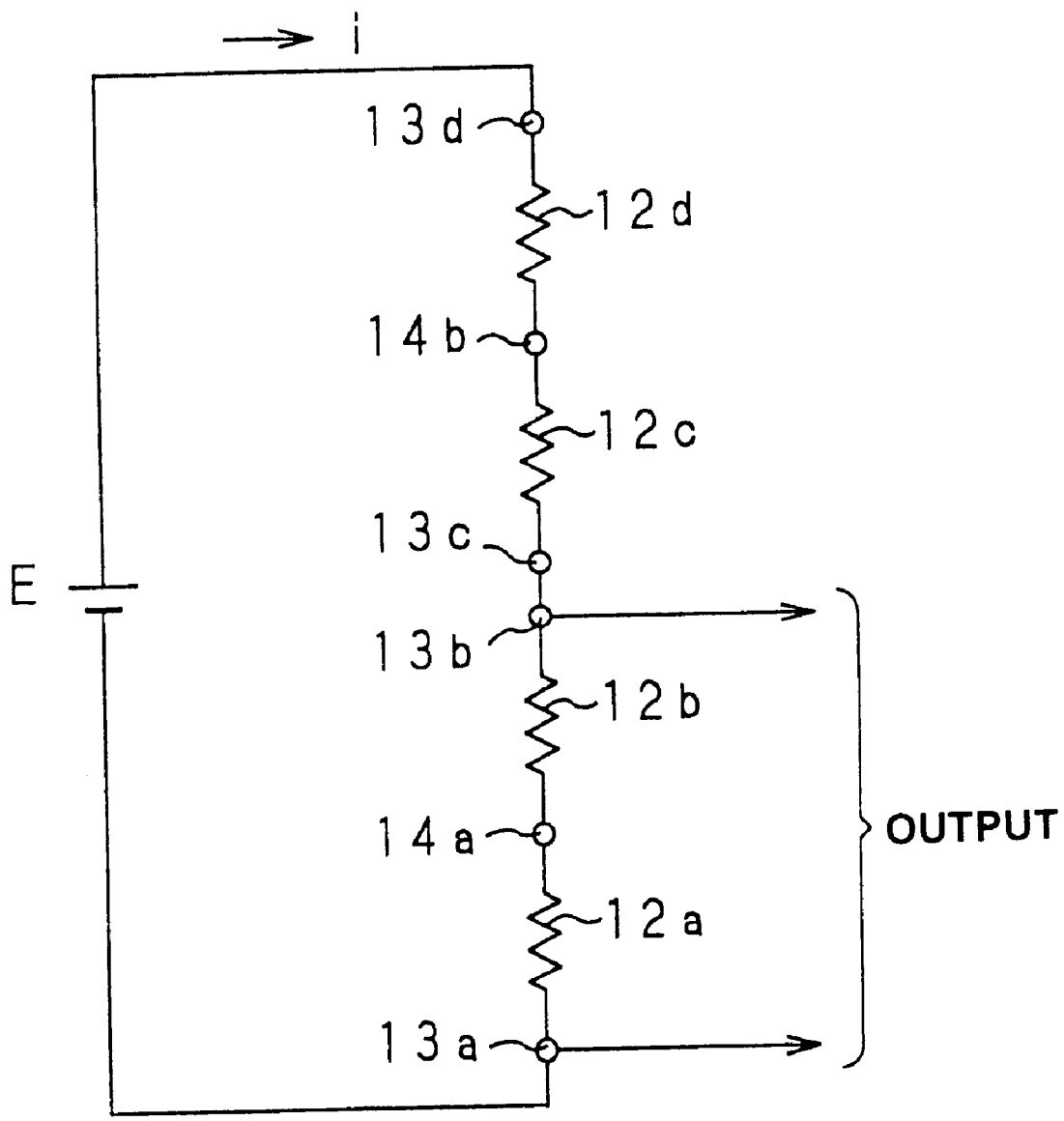
FIG. 11 is an equivalent circuit diagram of the magneto-resistive effect sensor.

To one longitudinal ends of the magnetically sensitive portions 12a to 12d are connected electrodes 13a to 13d, respectively. To the ends of the magnetically sensitive portions 12a and 12b not connected to the electrodes 13a and 13b is connected an electrode 14a for electrically interconnecting the magnetically sensitive portions 12a and 12b in series. To the ends of the magnetically sensitive portions 12c and 12d not connected to the electrodes 13c and 13d is connected an electrode 14b for electrically interconnecting the magnetically sensitive portions 12c and 12d in series. The electrode 13a, to which is connected the magnetically sensitive portion 12a, is grounded, while the electrode 13d, to which is connected the magnetically sensitive portion 12d, is connected to a constant voltage source. The electrodes 13b, 13c are interconnected by an external circuit, while the magnetically sensitive portions 12a to 12d are interconnected in series from the voltage source to the grounding terminal and flown through by the current i in the longitudinal direction. Thus, in the present MR sensor 3, the potential across the magnetically sensitive portion 12b at a mid point and the magnetically sensitive portion 12c is detected as a sensor output. That is, with the present MR sensor 3, an equivalent circuit shown in FIG. 11 is constituted by interconnecting the magnetically sensitive portions 12a to 12d in this manner to detect a sensor output at the electrode 13b or the electrode 13c.

The magnetically sensitive portions 12a to 12d are made up of mid portions 15a to 15d, and end portions 16a to 16d and 17a to 17d on both longitudinal ends of the mid portions 15a to 15d having different widths from those of the mid portions 15a to 15d in a direction perpendicular to the current flowing direction. Since the magnetically sensitive portions 12a to 12d are of the same shape, the magnetically sensitive portion 12a is explained as an example.

The mid portion 15a has a length along the current flowing direction substantially equal to the radius r of the magnetic scale 2, with the width in the direction perpendicular to the current flowing direction being w1. The mid portion 15a has the center along its length substantially equal to the center position Q1 in register with the shortest gap length between the magnetically sensitive portion 12a and the magnetic scale 2.

The end 16a is formed between the electrode 14a and the mid portion 15a and is increased gradually in width from one end of the mid portion 15a towards the electrode 14a so as to be connected to the electrode 14a with a width w2.

The end 17a is formed between the electrode 13a and the mid portion 15a and is increased gradually in width from the other end of the mid portion 15a towards the electrode 13a so as to be connected to the electrode 13a with a width w2.

The width w2 of the end 16a or the end 17a is not less than 1.5 and, for example, 2 times the width w1 of the mid portion 15a.

That is, in the present MR sensor 3, the magnetically sensitive portion 12 is formed so that the width of the MR sensor 3 in a direction perpendicular to the current flowing direction is narrower and broader in the portions thereof having a shorter gap length and a longer gap length with respect to the magnetic scale 2, respectively. The proportion between the width w1 and the width w2 is optimally set depending on the strength of the signal magnetic field applied and differs with the shape of the magnetic scale 2.

In the mid portion 15a where the length is short and the gap width of the MR sensor 3 is narrow, the rate of change of resistance and hence changes in resistance are increased with relative increase in electrical resistance, so that, in case of constant-voltage driving, a significant change in voltage can be produced. In the ends 16a and 17a with the long gap length and broad width of the MR sensor 3, the rate of change of electrical resistance is reduced with relative increase in electrical resistance, so that, in case of constant voltage driving, dependency on voltage is reduced.

Thus, in the present magnetically sensitive portion 12a of the MR sensor 3, in which the mid portion 15a with the narrow width in a direction perpendicular to the current flowing direction is connected in tandem with the ends 16a and 17a having the broader width in the above direction, it is possible to produce a sufficiently large output and an optimum S/N ratio on the whole. Also, with the present MR sensor 3, since the effective change in resistance is produced in the magnetically sensitive portion 12 in its entirety, a high output can be produced without reducing the gap length. Since there is no necessity of reducing the gap length, the MR sensor 3 can be assembled on the magnetic scale 2 with relative ease to improve the operational reliability.

The profile of the MR sensor 3 shown in FIG. 10 is given only as an example and the MR sensor 3 may be of any other suitable profile if its width in a direction perpendicular to the current flowing direction in the magnetically sensitive portion differs in dependence upon the strength of the signal magnetic field applied to the magnetically sensitive portion.

Figure 12:
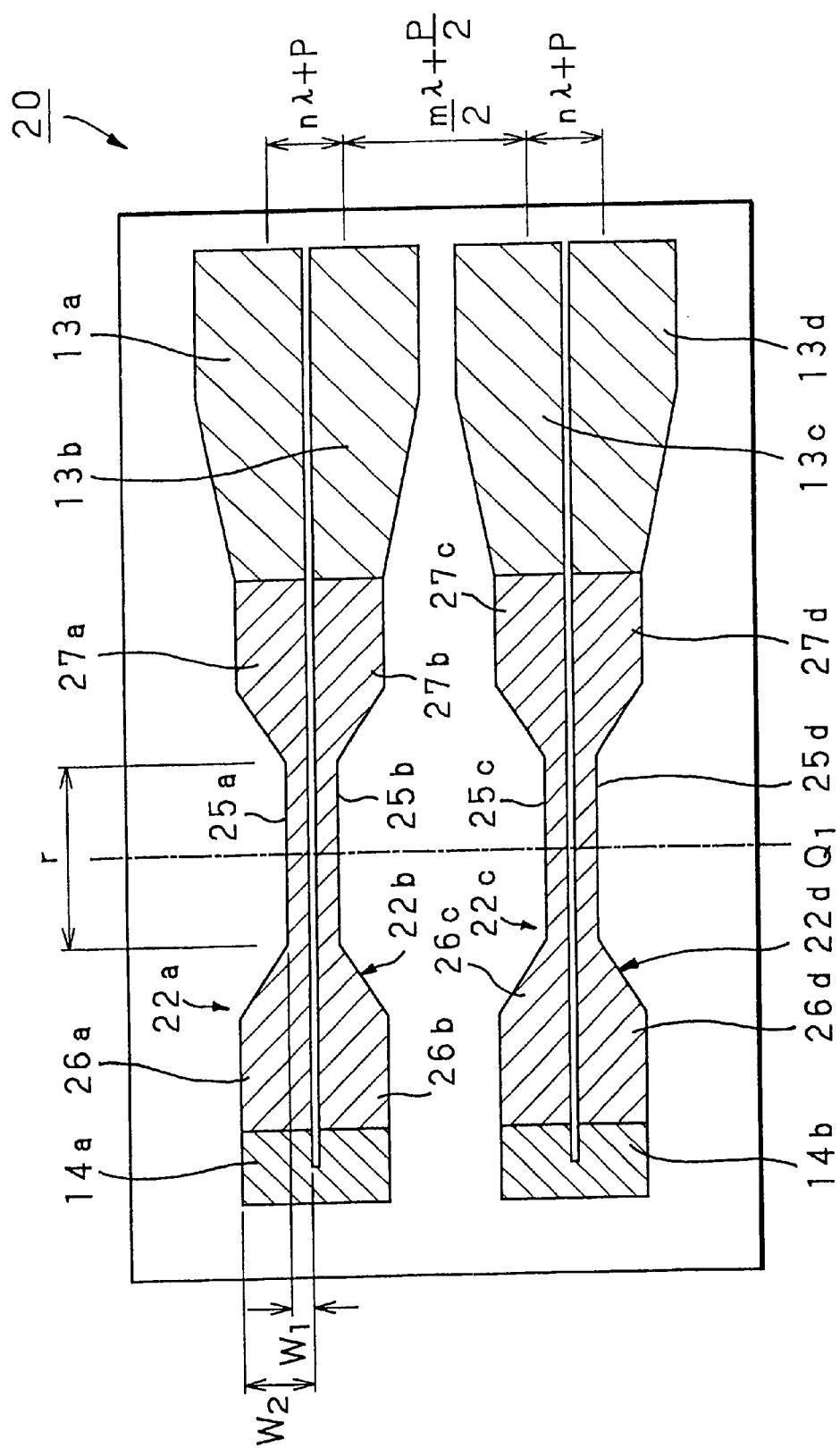
FIG. 12 illustrates a modified magneto-resistive effect sensor of the position detection device according to the first embodiment of the present invention.

As a modification of the MR sensor 3, an MR sensor 20 is shown in FIG. 12. In the following explanation of the MR sensor 20, the portions thereof which are the same as those of the MR sensor 3 are depicted by the same reference numerals and are not explained specifically.

In the MR sensor 20, first to fourth magnetically sensitive portions 22a to 22d are formed for extending parallel to its longitudinal direction.

The magnetically sensitive portion 22a to 22d are made up of mid portions 25a to 25d and ends 26a to 26d and 27a to 27d at the longitudinal ends of the mid portions 25a to 25d. These ends 26a to 26d and 27a to 27d have different widths.

The mid portion 25a of the magnetically sensitive portion 22a has its length along the current flowing direction substantially equal to the radius r of the magnetic scale 2 and has a width w1 along the direction perpendicular to the current flowing direction. The center of the mid portion 25a along its length substantially coincides with the center position Q1 having the minimum gap length between the magnetically sensitive portion 22a and the magnetic scale 2.

The end 26a is formed between the electrode 14a and the mid portion 25a and has a slanted edge only on one side opposite to the magnetically sensitive portion 22b, with the width of the end 26a increasing gradually from one end of the mid portion 25a towards the electrode 14a, with the end 26a being connected to the electrode 14a with the width w2.

The end 27a is formed between the electrode 13a and the mid portion 25a and has a slanted edge only on one side opposite to the magnetically sensitive portion 22b, with the width of the end 27a increasing gradually from one end of the mid portion 25a towards the electrode 13a, with the end 27a being connected to the electrode 13a with the width w2.

The width w2 of the end 26a or the end 27a is 1.5 times and, for example, approximately 2 times the width w1 of the mid portion 25a.

Also, the magnetically sensitive portion 22b is line-symmetrical in shape to the magnetically sensitive portion 22a, with a boundary between the portions 22a and 22b as center, and is arranged with respect to the magnetically sensitive portion 22a so that the non-slanted sides of the ends 26b, 27b face corresponding non-slanted sides of the ends 26a, 27a.

The magnetically sensitive portion 22c is of the same profile as the magnetically sensitive portion 22a, with the magnetically sensitive portion 22d being of the same shape as the magnetically sensitive portion 22b.

In the above-described MR sensor 20, as in the MR sensor 3, the rate of change of resistance and hence changes in resistance are increased with relative increase in electrical resistance, in the mid portions 25a to 25d where the gap length is short, so that, in case of constant-voltage driving, a significant change in voltage can be produced. In the ends 26a and 27a with the long gap length, the rate of change of electrical resistance is reduced with relative increase in electrical resistance, so that, in case of constant voltage driving, dependency on voltage is reduced. Therefore, in the magnetically sensitive portion 22 of the present MR sensor 20 in its entirety, in which the respective magnetically sensitive portions are connected in tandem, a sufficiently large output and an optimum S/N ratio can be produced.

The operation of the MR sensor 3 is hereinafter explained.

With movement of an object, the MR sensor 3 is moved relative to the position signals 4 on the magnetic scale 2. If, for example, the magnetically sensitive portions 12a, 12b of the MR sensor 3 are moved to above the N and S poles of the position signals 4, the resistance value reaches a maximum value, because the strength of the magnetic field of the component of the stray magnetic flux contained in the film surface is substantially zero. Conversely, the maximum magnetic field is applied across the magnetically sensitive portions 12c, 12d, so that the resistance value reaches the minimum value. Therefore, the maximum potential is obtained at the electrode 13b (13c).

If, for example, the magnetically sensitive portions 12c, 12d of the MR sensor 3 is moved to above the N and S poles of the position signals, the resistance value of the magnetically sensitive portions 12c, 12d reaches a maximum value, because the strength of the magnetic field of the component of the stray magnetic flux contained in the film surface is substantially zero. Conversely, the maximum magnetic field is applied across the magnetically sensitive portions 12a, 12b, so that the resistance value reaches the minimum value. Therefore, the minimum potential is obtained at the electrode 13b (13c).

Thus, in the MR sensor 3, signals produced at an interval P equal to one-half the recording pitch λ of the position signals as a result of movement on the magnetic scale 2 can be outputted at the electrodes 13b (13c) to enable detection of the object movement position.

It is also possible to use another sensor adapted for detecting a signal dephased by 90° corresponding to P/4 from the above signal to detect a relative position from these two signals.

Output characteristics of the MR sensor 3 are hereinafter explained in comparison with those of the conventional MR sensor.

Figure 13A:
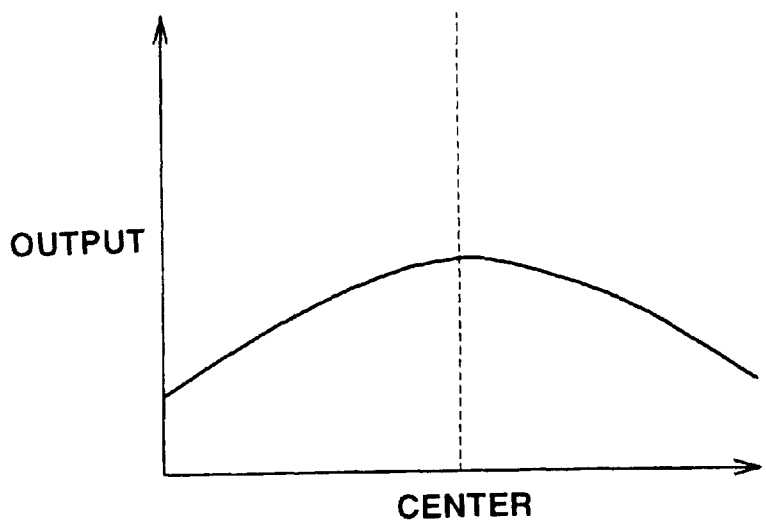
FIG. 13A is a graph showing output characteristics in case position signals recorded on a round-rod-shaped magnetic scale are detected by a conventional MR sensor having strip-shaped magnetically sensitive portions recorded thereon.
Figure 13B:
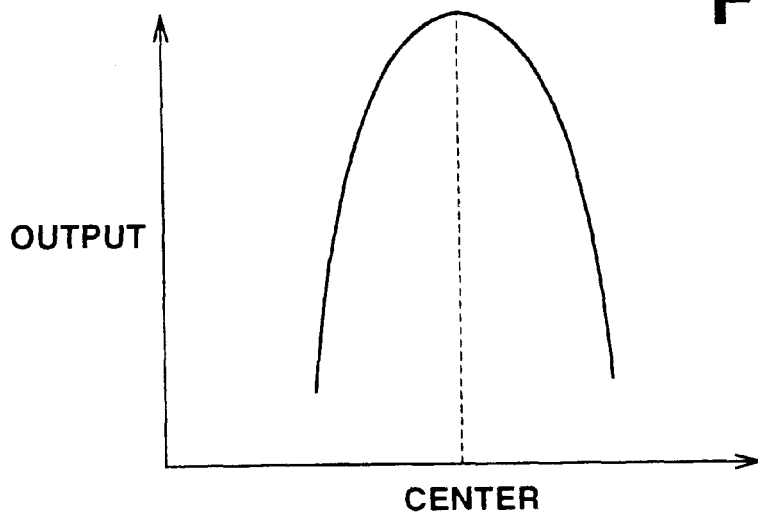
FIG. 13B is a graph showing output characteristics in which position signals recorded on the round-rod-shaped magnetic scale are detected by a conventional MR sensor having strip-shaped magnetically sensitive portions recorded thereon and also having the magnetically sensitive portion shorter in longitudinal length than the diameter of the magnetic scale.
Figure 13C:
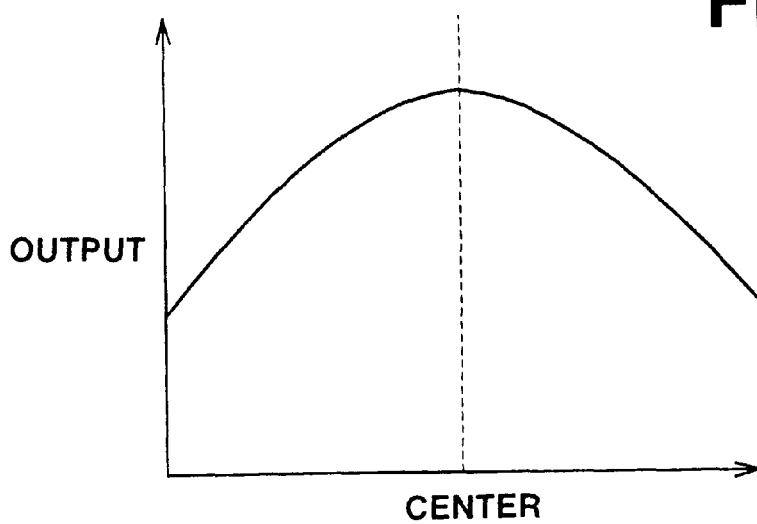
FIG. 13C is a graph showing output characteristics in case position signals recorded on the round-rod-shaped magnetic scale are detected by the MR sensor according to the present invention.

FIG. 13A shows output characteristics when position signals recorded on a round-rod-shaped magnetic scale are detected by a conventional MR sensor having a strip-shaped magnetically sensitive portion formed thereon. FIG. 13B shows output characteristics when position signals recorded on a round-rod-shaped magnetic scale are detected by a conventional MR sensor having a strip-shaped magnetically sensitive portion formed thereon and which has a length along the longitudinal direction of the magnetically sensitive portion shorter than the diameter of the magnetic scale. FIG. 13C shows output characteristics when position signals recorded on a round-rod-shaped magnetic scale are detected by the above-described MR sensor 3. The abscissa in each of FIGS. 13A to 13C represents the position to which the center position on the longitudinal direction of the magnetically sensitive portion, for example, the center position Q1 of the magnetically sensitive portion 12 in the case of the position detection device 1 of the first embodiment, is moved in a direction perpendicular to the longitudinal direction of the round-rod-shaped magnetic scale and parallel to the magnetically sensitive portion, that is in a direction along the current flowing direction in the magnetically sensitive portion. The ordinate in each of FIGS. 13A to 13C, on the other hand, represents the output voltage of the MR sensor.

As may be seen from comparison of FIGS. 13A to 13C, an output higher than an output of the conventional MR sensor, having a strip-shaped magnetically sensitive portion formed thereon, can be realized with the MR sensor 3 of the first embodiment, while an output higher than an output of the a conventional MR sensor having a magnetically sensitive portion shorter in length than the diameter of the magnetic scale can be achieved with the MR sensor 3, even if position deviation etc is produced.

Thus, with the position detection device 1 of the first embodiment, a sufficient output with optimum characteristics can be realized even if the magnetized surface of the magnetic scale 2 carrying the position signals 4 is curved. In addition, with the present position detection device 1, a larger distance can be maintained between the magnetic scale 2 and the MR sensor 3, thus assuring facilitated assembling and improved reliability.

Figure 14:
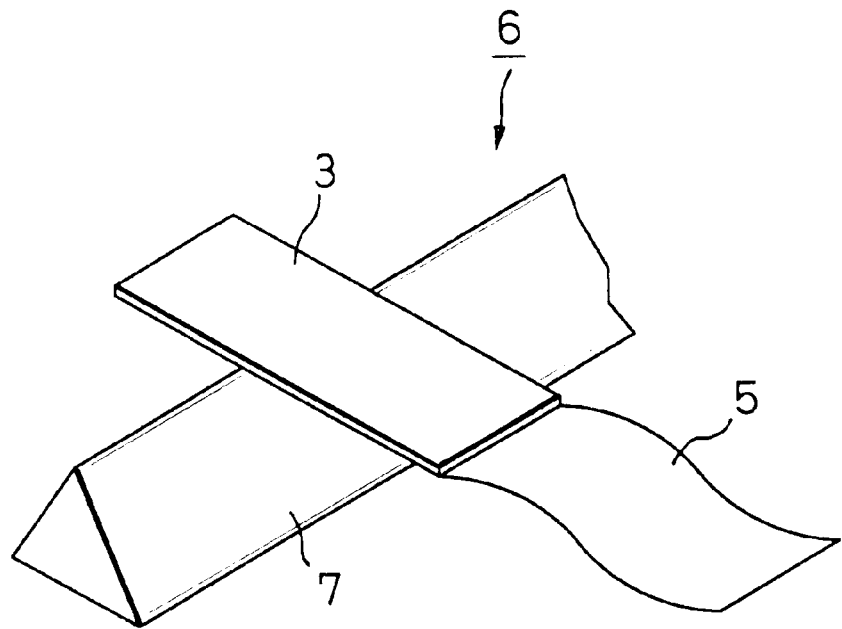
FIG. 14 illustrates a modification of the position detection device employing a magnetic scale in the form of a tri-pyramid according to the first embodiment of the present invention.
Figure 15:
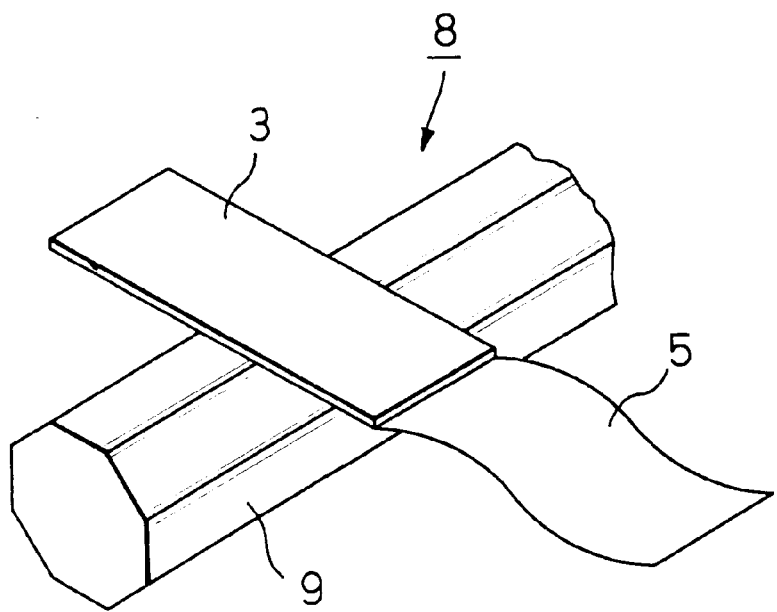
FIG. 15 illustrates a modification of the position detection device employing a magnetic scale in the form of an octo-pyramid according to the first embodiment of the present invention.

In the present invention, the magnetized surface of the magnetic scale is not limited to a curved surface. For example, the present invention can be applied to a position detection device employing a polygonally-shaped magnetic scale in order to detect the position information. For example, the position detection can be realized by a scale device 6 employing a tri-pyramidally shaped magnetic scale 7 as shown in FIG. 14, or by scale device 8 employing an octo-pyramidally shaped magnetic scale 7 as shown in FIG. 15. In these cases, the magnetically sensitive portion 12 of the MR sensor 3 is changed in shape depending on the stray magnetic flux applied from the magnetic scale 7 or the magnetic scale 9.

Thus, with the position detection devices 6 or 8, a sufficient output with optimum characteristics can be realized even if the magnetized surface of the magnetic scale 2 carrying the position signals 4 is polygonally-shaped.

The foregoing description of the first embodiment of the present invention has been directed to the position detection device 1 for detecting the position of an object in which the position signals 4 are continuously recorded at a pre-set recording pitch λ on the magnetic scale 2. The present invention, however, is not limited to this position detection device and may, for example, be such a position detection device in which point-of-origin signals each produced as an article being measured is moved a unit length are discretely recorded on a magnetized member are detected to detect the article position.

A position detection device according to a second embodiment of the present invention is hereinafter explained with reference to the drawings.

Figure 16:
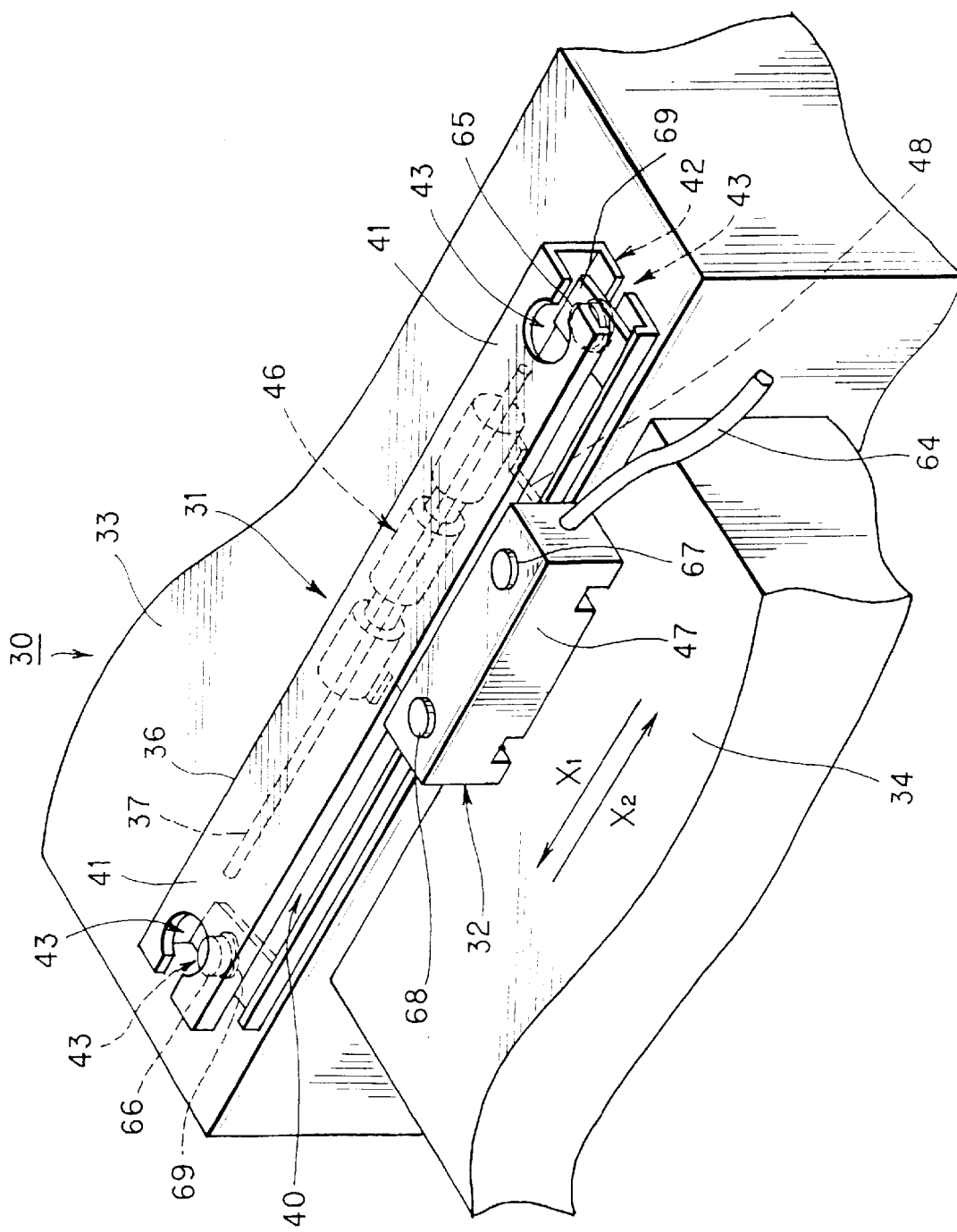
FIG. 16 is a perspective view of a position detection device according to a second embodiment of the present invention.
Figure 17:
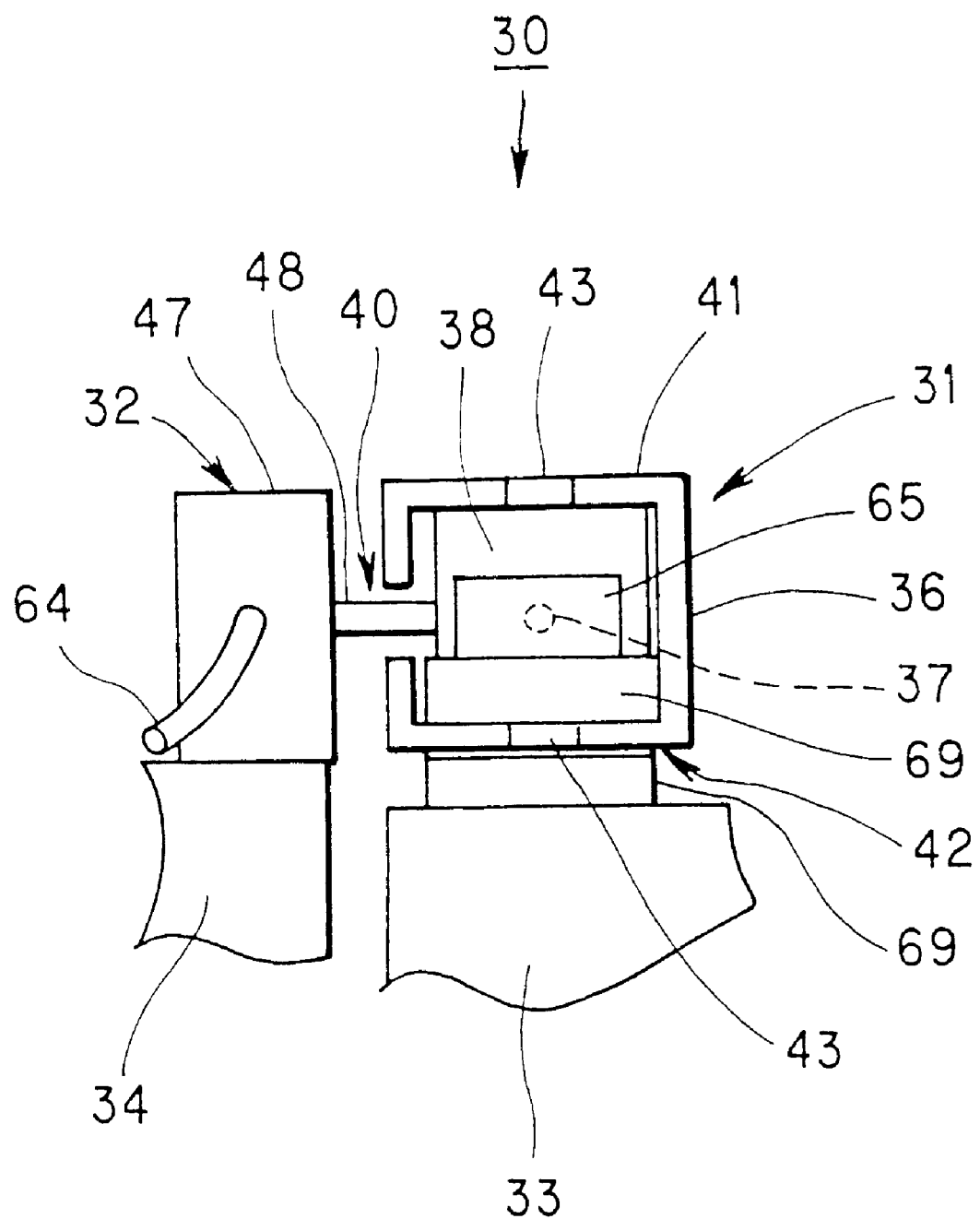
FIG. 17 is a side view of the position detection device according to the second embodiment of the present invention.
Figure 18:
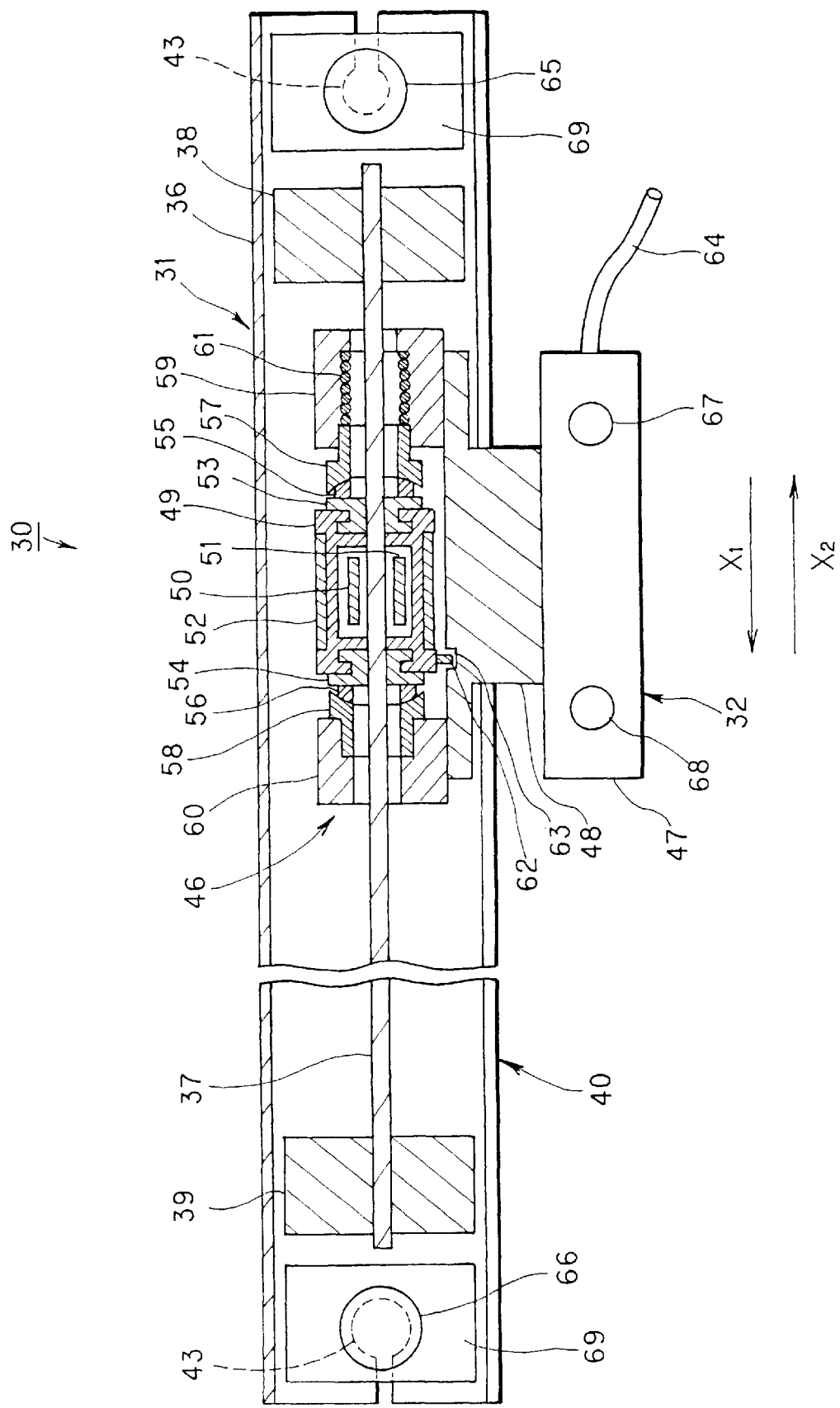
FIG. 18 is a cross-sectional view showing an internal structure of the position detection device according to the second embodiment of the present invention.

FIG. 16 is a perspective view showing a position detection device according to the second embodiment of the present invention and FIG. 17 is a side view of the position detection device of the present second embodiment. FIG. 18 is a cross-sectional view for illustrating the inner structure of the present second embodiment of the position detection device.

A position detection device 30, according to the second embodiment of the present invention, is made up of a main body unit 31 and a head slider 32 mounted on the main body unit 31.

This position detection device 30 is constituted as a part of a machine tool and is configured for detecting the position of relative movement between two members performing relative linear movement. For example, the position detection device 30 detects the position of relative movement between a reference unit 33 secured at a pre-set position and a movable unit 34 performing relative linear movement in the direction indicated by arrows X1 and X2 in FIG. 16 relative to this reference unit 33. In the position detection device 30, one of the main body unit 31 or the head slider 32 is mounted on the reference unit 33, with the other being mounted on the movable unit 34. In FIGS. 16 and 17, the main body unit 31 is mounted on the reference unit 33, while the head slider 32 is mounted on the movable unit 34.

The main body unit 31 is formed by a casing 36 and a recording medium that consists of round-rod-shaped high coercivity member. Within the inside of the casing 36, there are provided a magnetic scale 37 and brackets 38, 39 for holding both ends of the magnetic scale 37 for securing the magnetic scale 37 at a pre-set position in the casing 36. In FIG. 16, these brackets 38, 39 are not shown for simplicity of the drawing.

The casing 36 has, for example, the shape of a rectangular tube, one end of which is cut out to form a slit 40. The casing 36 is also formed with substantially circular casing mounting holes 43 at the longitudinal ends of the sides 41, 42 lying at right angle to the side thereof formed with the slit 40.

The magnetic scale 37 has its both ends held by the brackets 38, 39 and is secured in the casing 36. This magnetic scale 37 is parallel to the longitudinal direction of the casing 36 and is provided on the center axis of the rectangular tube. On this magnetic scale 37 are magnetically recorded scale signals and point-of-origin signals as position signals. These scale signals and point-of-origin signals will be explained later in detail.

The head slider 32 has a head holding unit 46 in the inside of the main body unit 31, a head carrier 47 and a connecting portion 48 interconnecting the head holding unit 46 and the head carrier 47. The head slider 32 is mounted on the main body unit 31 for movement along the length of the magnetic scale 37.

Figure 19:
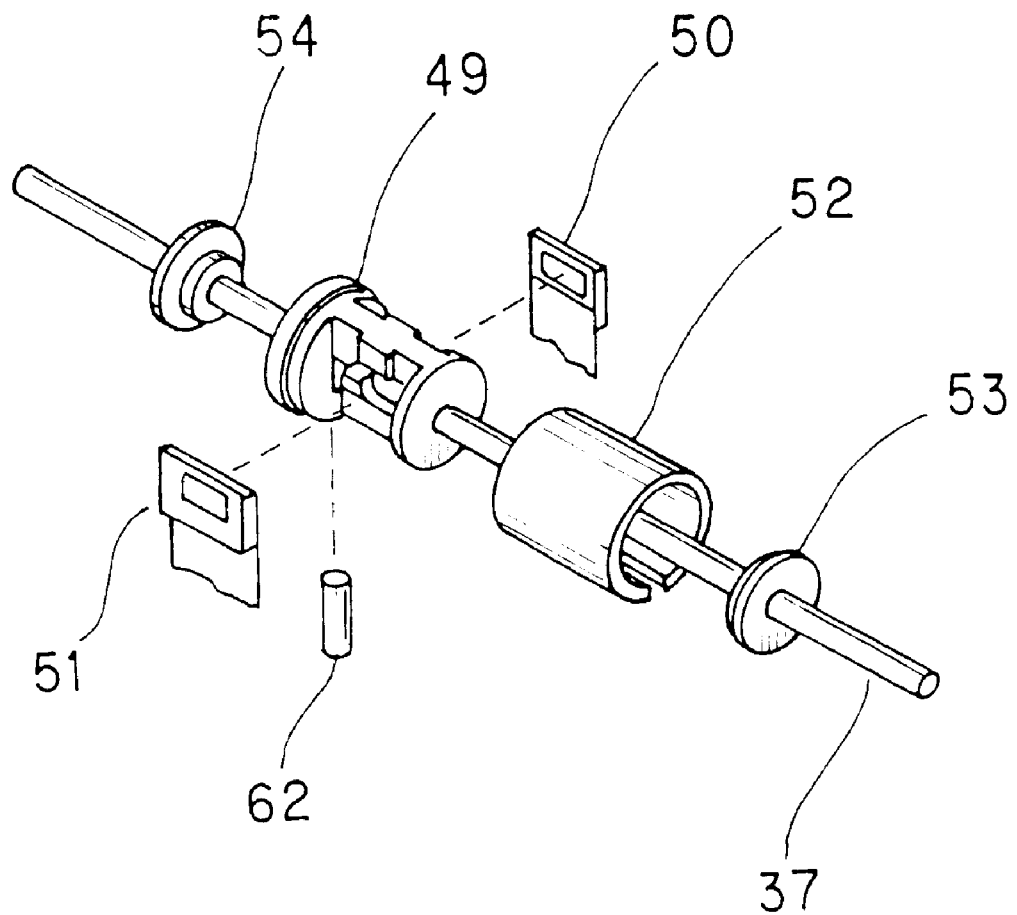
FIG. 19 is an exploded perspective view showing a head holder of the position detection device according to the second embodiment of the present invention.

FIG. 19 shows an exploded perspective view of essential parts of the head holding unit 46.

The head holding unit 46 includes a head holder 49 provided with a through-hole for the magnetic scale 37. The head holder 49 is mounted on the magnetic scale 37, by having the magnetic scale 37 introduced into the through-hole, for linear movement in the longitudinal direction of the magnetic scale 37.

The head holder 49 has its outer side covered by a head holder casing 52 and holds in its inside an MR sensor for scale signals 50 and an MR sensor for point-of-origin signals 51. The MR sensor for scale signals 50 detects the scale signals recorded on the magnetic scale 37. The MR sensor for point-of-origin signals 51 detects the point-of-origin signals recorded on the magnetic scale 37. The MR sensor for scale signals 50 and the MR sensor for point-of-origin signals 51 are held by the head holder 49 and hence are moved in translation along the longitudinal direction of the magnetic scale 37 with the linear movement of the head holder 49. The structure and the arraying position of the MR sensor for scale signals 50 and the magnetic scale 37 of the MR sensor for point-of-origin signals 51 will be explained in detail subsequently.

On both longitudinal ends of the magnetic scale 37 of the head holder 49 are mounted a pair of sliding supporting members 53, 54. These sliding supporting members 53, 54 are substantially columnar in profile and are provided with center through-holes for passage of the magnetic scale 37 therethrough. The sliding supporting members 53, 54 are slidably supported on the magnetic scale 37 by having the magnetic scale 37 passed through these through-holes. The sliding supporting members 53, 54 are slidably supported on the magnetic scale 37, so that, when the head holder 49 is translated along the longitudinal direction of the magnetic scale 37, the head holder 49 is not wobbled in a direction perpendicular to its movement direction.

The head holding unit 46 is provided with paired first spacers 55, 56 and paired second spacers 57, 58 as shown in FIG. 18.

The paired first spacers 55, 56 are provided with through-holes for passage of the magnetic scale 37 therethrough. By having the magnetic scale 37 passed through these through-holes, the paired first spacers 55, 56 are mounted on the magnetic scale 37 for performing linear movement in the longitudinal direction of the magnetic scale 37. The paired first spacers 55, 56 compress against a longitudinal end face of the magnetic scale 37 not carrying the head holder 49.

The paired second spacers 57, 58 are provided with through-holes for passage of the magnetic scale 37 therethrough. By having the magnetic scale 37 passed through these through-holes, the paired second spacers 57, 58 are mounted on the magnetic scale 37 for performing linear movement in the longitudinal direction of the magnetic scale 37. The paired first spacers 55, 56 compress against a longitudinal end face of the magnetic scale 37 not compressing against the sliding supporting members 53, 54.

The head holding unit 46 is provided with a pair of head holder clinching members 59, 60 and a spring 61.

The head holder clinching members 59, 60 are provided with through-holes for passage of the magnetic scale 37 therethrough. By having the magnetic scale 37 passed through these through-holes, the head holder clinching members 59, 60 are mounted on the magnetic scale 37 for performing linear movement in the longitudinal direction of the magnetic scale 37. The head holder clinching members 59, 60 also are secured to the connecting portion 48. These paired head holder clinching members 59, 60 clamp the head holder 49, carrying the sliding supporting members 53, 54, from both ends of the magnetic scale 37, looking in the direction along its length, via a pair of first spacers 55, 56 and a pair of second spacers 57, 58. The spring 61 is provided between the head holder clinching member 59 and the second spacer 57. The spring 61 biases the head holder 49 in a direction proceeding from the head holder clinching member 59 towards the head holder clinching member 60.

The head holder 49 is provided with a rotation stop pin 62 having its one longitudinal end secured to the head holder 49 and having its other end introduced into a rotation controlling hole 63 provided in the connecting portion 48. This regulates the rotation of the head holder 49 about the magnetic scale 37 as the center of rotation.

The abutting surfaces of the first spacers 55, 56 and the second spacers 57, 58 are spherically-shaped and operate for reducing the bending moment applied by the sliding supporting members 53, 54 against the magnetic scale 37 when the head holder clinching members 59, 60 are subjected to position deviation in a direction in which the head holder clinching members 59, 60 crosses the longitudinal direction of the magnetic scale 37.

The above-described head holding unit 46 is mounted on the magnetic scale 37 for movement in a direction parallel to the longitudinal direction of the magnetic scale 37. With this movement of the head holding unit 46, the MR sensor for scale signals 50 and the MR sensor for point-of-origin signals 51 detect the scale signals and the point-of-origin signals recorded on the magnetic scale 37.

This head holding unit 46 is connected to the head carrier 47 via the connecting portion 48. This connecting portion 48 has its end along the direction of crossing the longitudinal direction of the magnetic scale 37 secured to the head holder clinching members 59, 60, with the other end of the connecting portion 48 exiting from the slit 40 so as to be secured to the head carrier 47 provided outside of the main body unit 31.

Thus, the head slider 32 is made up of the head holding unit 46, head carrier 47 and the connecting portion 48 and is mounted on the main body unit 31 for movement along the longitudinal direction of the magnetic scale 37. The head slider 32 sends the scale signals and the point-of-origin signals, detected by the MR sensor for scale signals 50 and the MR sensor for point-of-origin signals 51, responsive to the relative movement with respect to the main body unit 31, to a controller, not shown, via a signal cable 64 provided on the head carrier 47.

The above-described position detection device 30 is arranged so that the magnetic scale 37 will be parallel to the direction of relative movement between the reference unit 33 and the movable unit 34 and so that the slit 40 will be opened towards the movable unit 34. When the position detection device 30 is arranged in this manner, the main body unit 31 has one of its lateral surfaces 41 or 42, lying at right angles to its lateral surface carrying the slit 40, as a mounting surface. The head slider 32 of the position detection device 30, thus arranged, is secured to the movable unit 34 by bolts for sliders 67, 68.

Thus, with the present position detection device 30, the relative position between the main body unit 31 and the head slider 32 is changed with linear movement of the movable unit 34. The MR sensor for scale signals 50 and the MR sensor for point-of-origin signals 51, provided in the head slider 32, detect the scale signals and the point-of-origin signals, changed with changes in this relative position, in order to detect the movement position of the movable unit 34.

The scale signals and the point-of-origin signals, recorded on the magnetic scale 37, are hereinafter explained.

Figure 20:
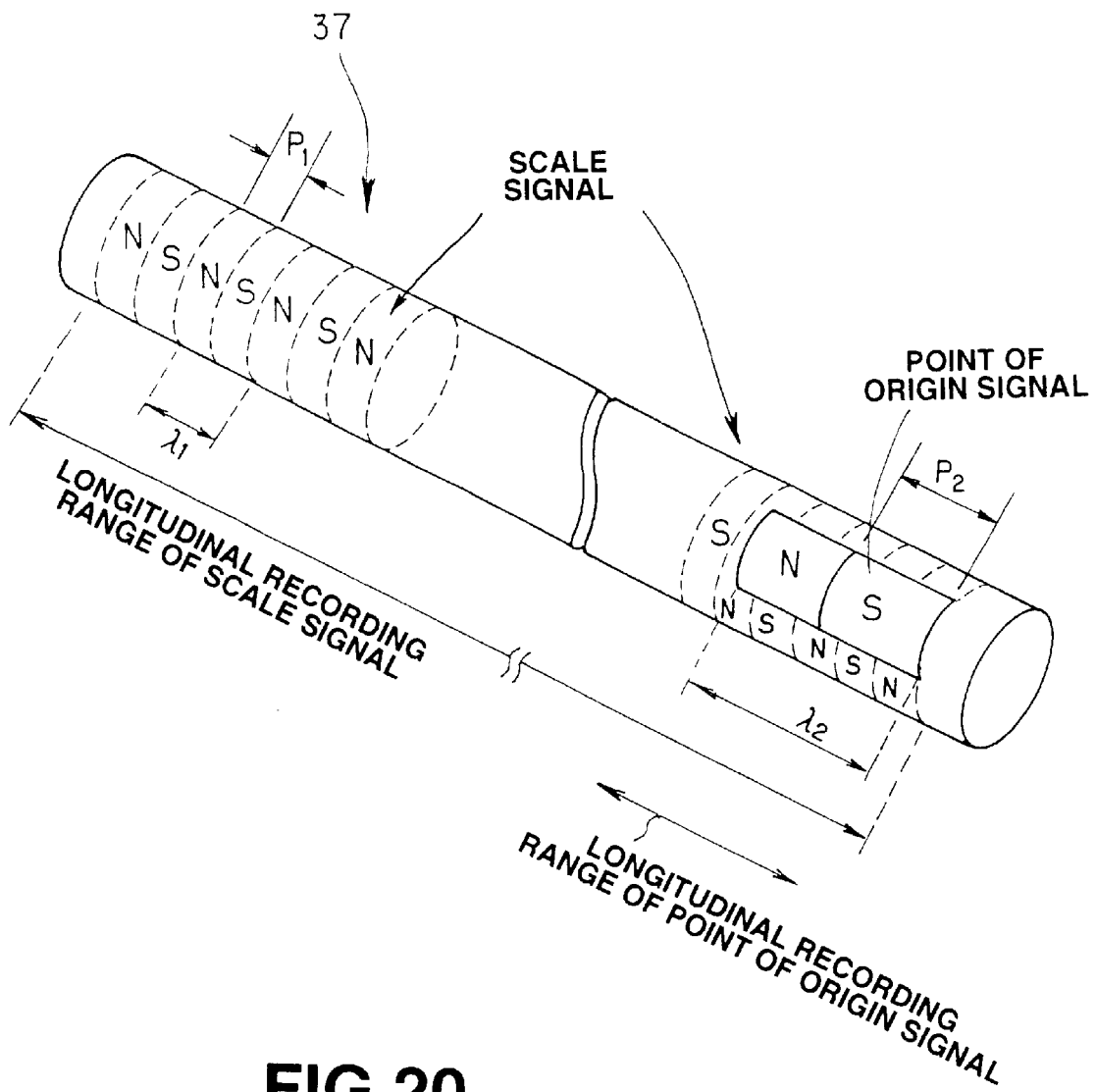
FIG. 20 illustrates scale signals recorded on the magnetic scale of the position detection device and a point-of-origin signals.

The scale signals are periodic signals, made up of alternating N and S poles, recorded in succession along the longitudinal direction of the magnetic scale 37. Specifically, there are recorded on the magnetic scale 37 of the position detection device 30 a series of magnetic signals of alternately inverted polarities, as scale signals, at a pre-set recording pitch (recording wavelength) $\lambda_1$, for extending along the longitudinal direction of the magnetic scale 37, as shown in FIG. 20. It is noted that these scale signals are recorded for substantially the entire length of the magnetic scale 37. By employing the magnetic scale 37, carrying these scale signals, the position detection device 30 can detect changes in the position of relative movement between the main body unit 31 and the head slider 32 in terms of the wavelength every detection pitch $P_1(P_1=\lambda_1/2)$ for enabling continuous detection of the relative positions of the reference unit 33 and the movable unit 34.

The point-of-origin signals are each a discrete magnetic signal, such as a one-wavelength magnetic signal, recorded at a pre-set longitudinal position. Specifically, there is recorded on the magnetic scale 37 of the position detection device 30 at least one point-of-origin signal along the longitudinal direction in superposition on the scale signals, as shown in FIG. 20. This recording pitch $\lambda 2$ of the point-of-origin signal is of a wavelength longer than the recording pitch $\lambda_1$ of the scale signals and is of wavelength twice the recording pitch $\lambda_1$ of the scale signals or longer. The point-of-origin signal is recorded at a portion on the outer rim of the round-rod-shaped magnetic scale 37. This point-of-origin signals are recorded on the outer rim over a range of the center angle of approximately 60° of the round-rod-shaped magnetic scale 37. By using the magnetic scale 37, having the point-of-origin signals recorded thereon, the position detection device 30 can detect the reference positions, such as the initial setting positions of the main body unit 31 and the head slider 32 or the point-of-origin position, thus enabling setting of the relative position between the reference Unit 33 and the movable unit 34 to a reference position.

The following is the result of comparison of the above-described scale signals and the point-of-origin signals.

The recording pitch $\lambda 2$ of the point-of-origin signals is longer than the recording pitch $\lambda_1$ of the scale signals and is, for example, twice the recording pitch $\lambda_1$ of the scale signals or longer. The scale signals are recorded in succession as magnetic signals alternately inverted in polarity and which are extended substantially along the entire length of the magnetic scale 37. The point-of-origin signals are discrete one-wavelength magnetic signals recorded at least at a zone alongthe longitudinal direction of the magnetic scale 37. In addition, the scale signals are recorded on the entire outer peripheral surface of the round-rod-shaped magnetic scale 37, in other words, on its outer peripheral surface with a center angle of 360° C., whereas the point-of-origin signals are recorded in a portion of the outer peripheral surface, such as over an angular extent corresponding to the center angle of 60°, of the magnetic scale 37. The recording portion can be used for the center angle of the order of 60±30°.

The mounting positions of the MR sensor for scale signals 50 and the MR sensor for point-of-origin signals 51 are hereinafter explained.

The MR sensor for scale signals 50 and the MR sensor for point-of-origin signals 51 are held by the head holder 49 mounted on the magnetic scale 37, as explained previously.

Figure 21:
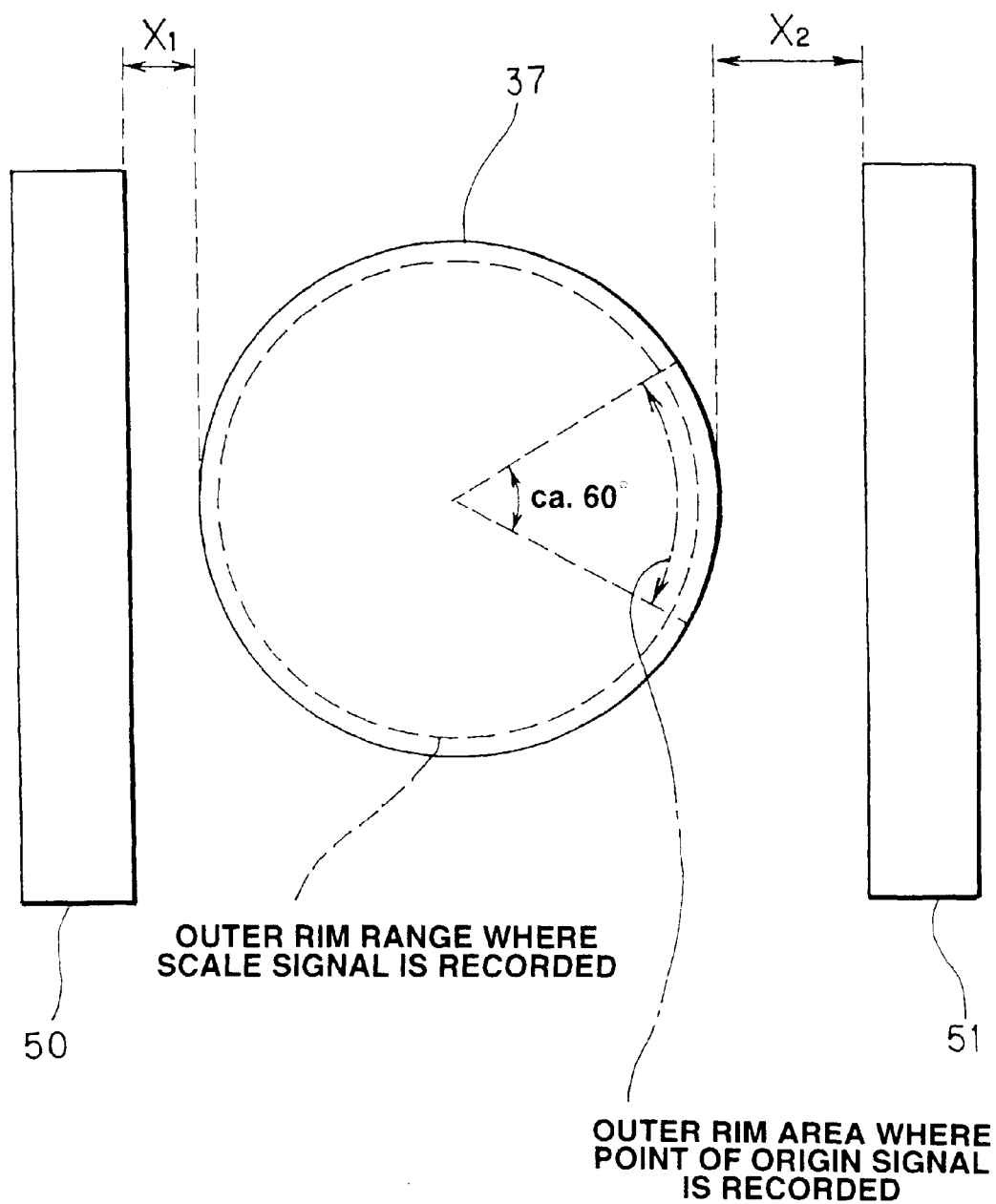
FIG. 21 illustrates the relative positions of a magnetic scale having scale signals and a point-of-origin signals and an MR sensor for scale signals and a point-of-origin signals.

Referring to FIG. 21, the MR sensor for point-of-origin signals 51 is arranged so that, when the MR sensor for point-of-origin signals 51 is moved in a direction parallel to the longitudinal direction of the magnetic scale 37, the MR sensor for point-of-origin signals 51 faces the point-of-origin signals recorded in a portion of the outer periphery of the magnetic scale 37. That is, the MR sensor for point-of-origin signals 51 is arranged facing the outer peripheral surface over an area of the center angle of 60° of the magnetic scale 37.

The MR sensor for scale signals 50 is arranged facing the MR sensor for point-of-origin signals 51 with the magnetic scale 37 in-between.

The MR sensor for scale signals 50 is arranged at a spacing x1 from the outer periphery of the magnetic scale 37. This spacing x1 is set in dependence upon the material or the radius of the magnetic scale 37 for sufficiently enlarging a detection output. The MR sensor for point-of-origin signals 51 is arranged at a spacing x2 from the magnetic scale 37 which is larger than the above spacing x1. For example, the spacing x2 between the magnetic scale 37 and the MR sensor for point-of-origin signals 51 is approximately twice the spacing x1 between the magnetic scale 37 and the MR sensor for scale signals 50.

On the head holder 49, holding the MR sensor for scale signals 50 and the MR sensor for point-of-origin signals 51, arranged at these positions, the paired slide support members 53, 54 are mounted at both longitudinal ends of the magnetic scale 37. Thus, with the head holder 49, the MR sensor for scale signals 50 and the MR sensor for point-of-origin signals 51 can be translated without producing position deviation in a direction at right angles to the longitudinal direction of the magnetic scale 37. The head holder 49 is provided with the rotation stop pin 62, as described above, for regulating the rotation of the head holder 49 about the magnetic scale 37 as the center of rotation. This holds the MR sensor for point-of-origin signals 51 at all times at a position facing the outer lateral surface of the magnetic scale 37 having the point-of-origin signals recorded thereon.

The above-described MR sensor for scale signals 50 is arranged at an optimum separation from the outer peripheral surface of the magnetic scale 37 sufficient to permit detection of the point-of-origin signals , while being arranged facing the outer peripheral surface of the magnetic scale 37 not having the point-of-origin signals recorded thereon. The result is that the MR sensor for scale signals 50 can detect signals from the scale recorded on the entire outer peripheral surface of the magnetic scale 37 without being affected by the point-of-origin signals.

The MR sensor for point-of-origin signals 51 is arranged facing the outer peripheral area of the magnetic scale 37 carrying the recorded point-of-origin signals, while being arranged at a separation from the outer peripheral surface of the magnetic scale 37 larger than the corresponding spacing of the MR sensor for scale signals 50 for attenuating the scale signals. On the magnetic scale 37 are recorded the point-of-origin signals of a recording wavelength longer than the recording wavelength of the scale signals. Thus, the MR sensor for point-of-origin signals 51 can detect the point-of-origin signals, without being affected by the scale signals, in accordance with the basic theory of the magnetic spacing loss stating that the shorter the recording length (wavelength), the more significant is the spatial magnetic attenuation.

The structure of the MR sensor for scale signals 50 is explained in further detail.

Figure 22:
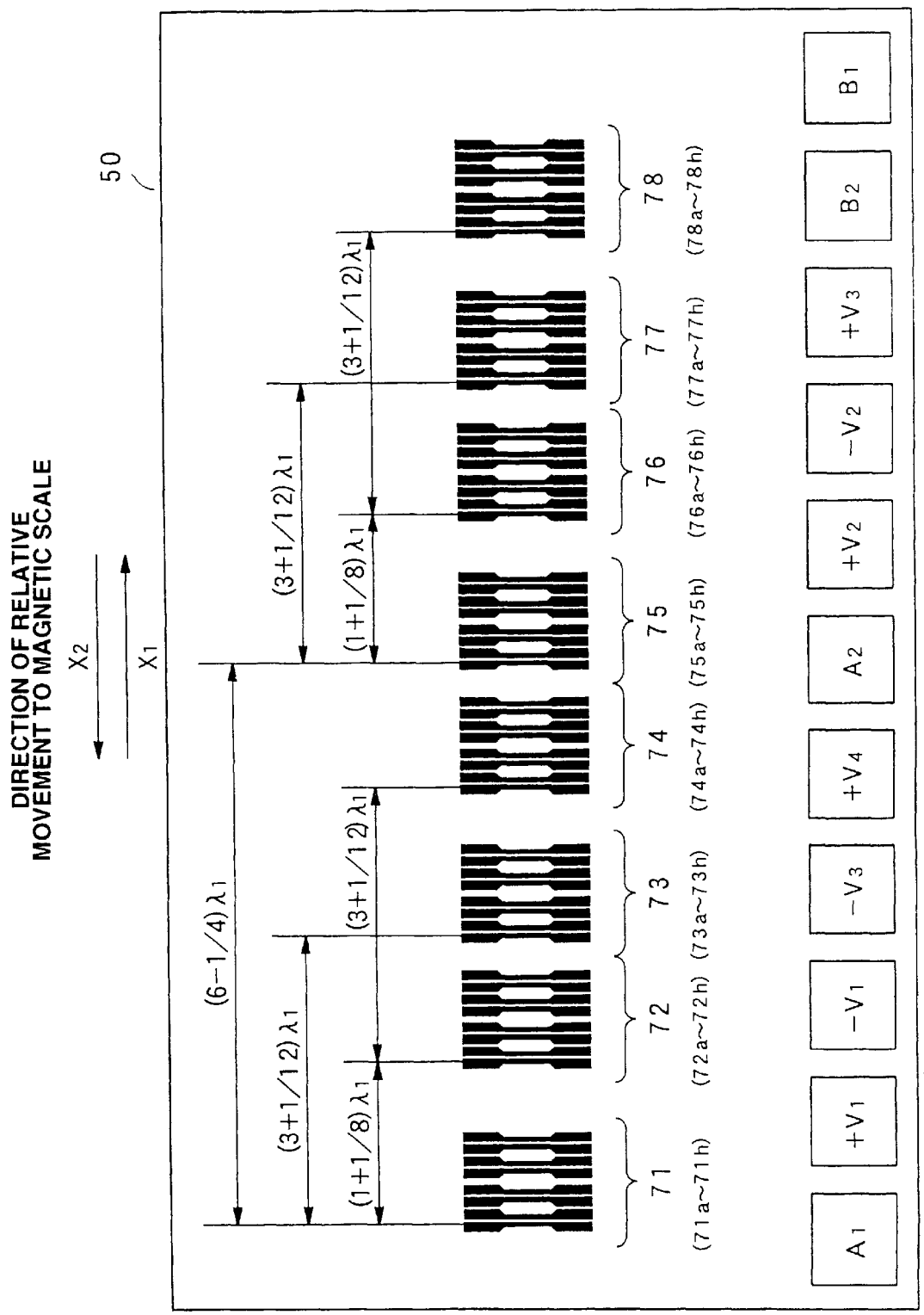
FIG. 22 shows a pattern of groups of line elements formed on a substrate of the MR sensor for scale signals, line elements and electrodes.
Figure 23:
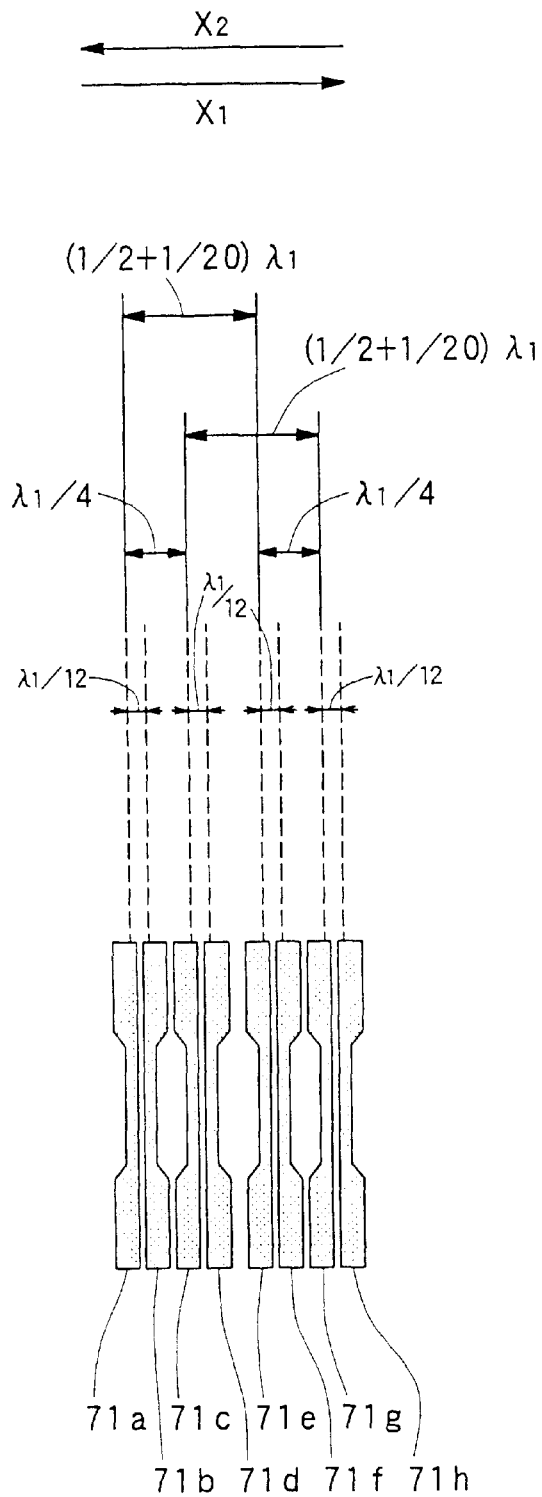
FIG. 23 schematically shows a pattern of line elements in a group of line elements formed on the substrate of the substrate of the MR sensor for scale signals.

FIG. 22 shows the set of line groups and a pattern of line elements and electrodes, formed on the substrate of the MR sensor for scale signals 50, while FIG. 23 schematically shows the pattern of line elements in the group of elements formed on the substrate of the MR sensor for scale signals 50.

On the MR sensor for scale signals 50 are formed 64 line elements exhibiting magneto-resistive effect by formation of the ferromagnetic material, such as Fe—Ni or Ni—Co, on a substrate formed of a non-magnetic material, such as glass. These 64 line elements are formed so that their longitudinal direction is at right angles with the relative movement direction of the magnetic scale 37. The current is caused to flow in this longitudinal direction. These 64 line elements, formed on the substrate, are arrayed parallel to the relative movement direction with respect to the magnetic scale 37 (direction of X1 and X2 in FIG. 22).

Similarly to the line elements formed on the MR sensor 3 of the first embodiment, each line element has a width in a direction at right angles to the current flowing in the line elements varying with the strength of the signal magnetic field applied to the line elements from the magnetic scale 2. That is, each line element is of a reduced width at a mid portion having a narrow gap with respect to the round-rod-shaped magnetic scale 37, while being of an increased width in the end portions having a broader gap with respect to the round-rod-shaped magnetic scale 37.

The 64 line elements formed on the MR sensor for scale signals 50 are divided into first to eighth line element groups 71 to 78 each made up of eight line elements.

FIG. 22 shows the relative disposition of the second to eighth line element groups 72 to 78 with respect to a first line element group 71 as a reference. Specifically, the second line element group 72 is formed at a position spaced $(1+\frac{1}{8})\lambda_1$ from the first line element group 71 in the X1 direction. The third line element group 73 is formed at a position spaced $(3+\frac{1}{12})\lambda_1$ from the first line element group 71 in the X1 direction. The fourth line element group 74 is formed at a position spaced $(3+\frac{1}{12})\lambda_1$ from the second line element group 72 in the X1 direction. The fifth line element group 75 is formed at a position spaced $(6-\frac{1}{4})\lambda_1$ from the first line element group 71 in the X1 direction. The sixth line element group 76 is formed at a position spaced $(1+\frac{1}{8})\lambda_1$ from the fifth line element group 75 in the X1 direction. The seventh line element group 77 is formed at a position spaced $(3+\frac{1}{12})\lambda_1$ from the fifth line element group 75 in the X1 direction. The eighth line element group 78 is formed at a position spaced $(3+\frac{1}{12})\lambda_1$ from the sixth line element group 76 in the X1 direction.

Meanwhile, the X1 direction denotes one of relative movement directions between the magnetic scale 37 and the MR sensor for scale signals 50, with $\lambda_1$ being a recording pitch of the scale signals recorded on the magnetic scale 37.

The line element groups 71 to 78 are each made up of eight line elements, that is first to eighth line elements.

The relative disposition of the first line element 71a to the eighth line element 71h in the first line element group 71 is shown in FIG. 23. Specifically, the second line element 71b is formed at a position spaced apart $(\lambda_1/12)$ from the first line element 71a in the X1 direction. The fourth line element 71d is formed at a position spaced apart $(\lambda_1/12)$ from the third line element 71c in the X1 direction. The sixth line element 71f is formed at a position spaced apart $(\lambda_1/12)$ from the fifth line element 71e in the X1 direction. The eighth line element 71h is formed at a position spaced apart $(\lambda_1/12)$ from the seventh line element 71g in the X1 direction. The third line element 71c is formed at a position spaced apart $(\lambda_1/4)$ from the first line element 71a in the X1 direction. The seventh line element 71g is formed at a position spaced apart $(\lambda_1/4)$ from the fifth line element 71e in the X1 direction. The fifth line element 71e is formed at a position spaced apart $(\frac{1}{2}+\frac{1}{20})\lambda$ from the first line element 71a in the X1 direction. The seventh line element 71g is formed at a position spaced apart $(\frac{1}{2}+\frac{1}{20})\lambda$ from the third line element 71c in the X1 direction.

Although the first line element group 71 is taken as an example in the foregoing, the relative disposition of the respective line elements in the line element group is the same in the entire first to eighth line element groups 71 to 78, and hence is not explained herein specifically.

On the substrate of the MR sensor for scale signals 50 are formed connection terminals for supplying the voltage from outside and for supplying the detected scale signals to outside.

On the substrate of the MR sensor for scale signals 50 are provided seven voltage input terminals, namely a voltage input terminal (+V1), a voltage input terminal (−V2), a voltage input terminal (+V2), a voltage input terminal (−V2), a voltage input terminal (+V3), a voltage input terminal (−V3), and a voltage input terminal (+V4), as shown in FIG. 22. On the substrate of the MR sensor for scale signals 50 are provided four output terminals, namely output terminals A1, A2, B1 and B2, as shown in FIG. 22.

A voltage of 5 V is applied across each of the voltage input terminals (+V1), (+V2),(+V3) and (+V4). The ground potential is applied across each of the voltage input terminals (−V1), (−V2) and (−V3).

Figure 24:
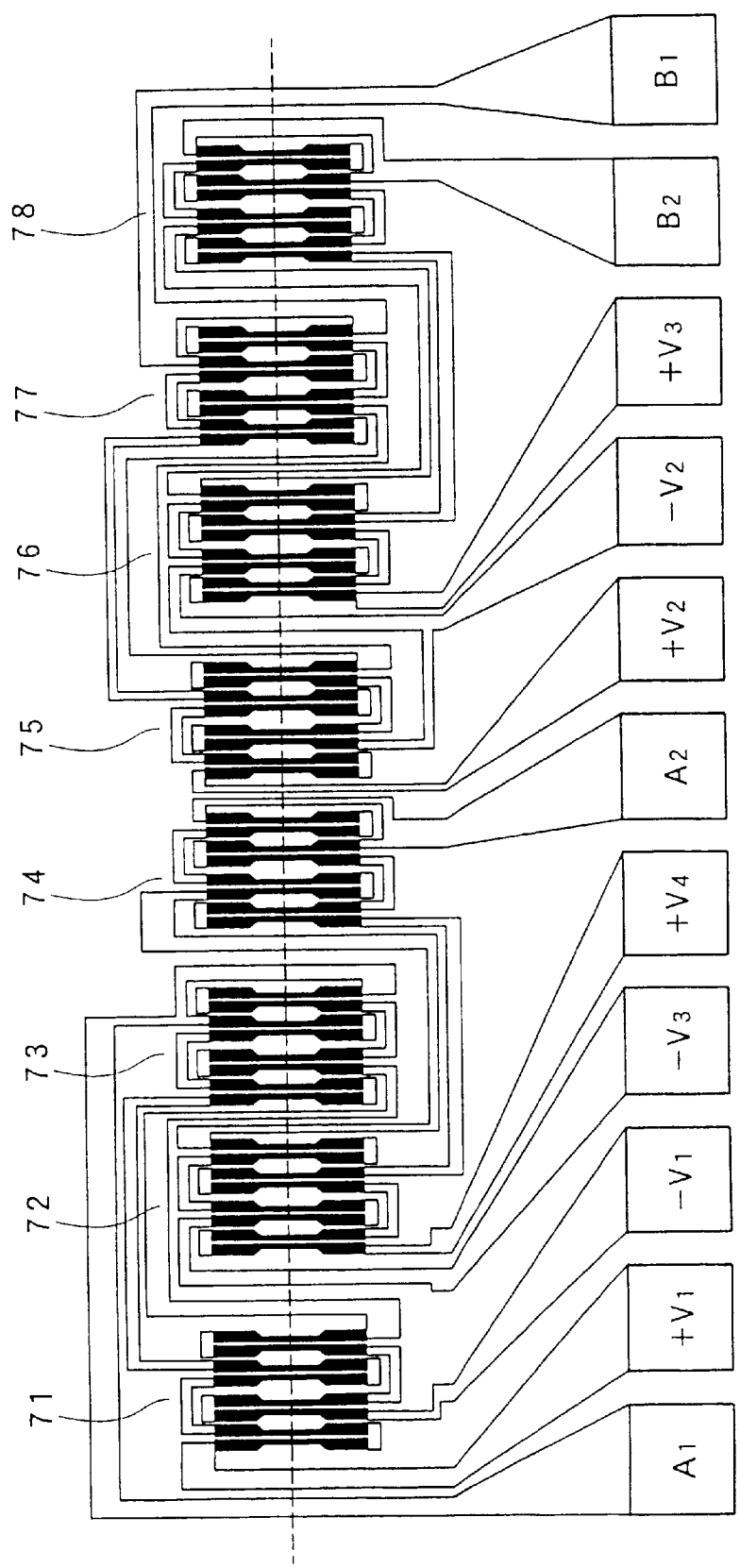
FIG. 24 illustrates the interconnection of 64 line elements formed on the MR sensor for scale signals, input terminals and output terminals of the respective voltages.

The interconnection of the 64 line elements formed on the MR sensor for scale signals 50 and the respective input and output terminals is explained with reference to FIG. 24.

There are connected in series eight line elements between the voltage input terminal (+V1) and the output terminal (A1). Between the voltage input terminal (+V1) and the output terminal (A1), there are connected a first line element 71a of the first line element group 71, a second line element 71b of the first line element group 71, a fifth line element 71e of the first line element group 71, a sixth line element 71f of the first line element group 71, a first line element 73a of the third line element group 73, a second line element 73b of the third line element group 73, a fifth line element 73e of the third line element group 73, and a sixth line element 73f of the third line element group 73, in the order of connection looking from the side of the voltage input terminal (−V1).

There are connected in series eight line elements between the voltage input terminal (−V1) and the output terminal (A1). Between the voltage input terminal (−V1) and the output terminal (A1), there are connected a third line element 71c of the first line element group 71, a fourth line element 71d of the first line element group 71, a seventh line element 71g of the first line element group 71, an eighth line element 71h of the first line element group 71, a third line element 73c of the third line element group 73, a fourth line element 73d of the third line element group 73, a seventh line element 73g of the third line element group 73, and an eighth line element 73h of the third line element group 73, in the order of connection looking from the side of the voltage input terminal (−V1).

There are connected in series eight line elements between the voltage input terminal (+V2) and the output terminal (B1). Between the voltage input terminal (+V2) and the output terminal (B1), there are connected a first line element 75a of the fifth line element group 75, a second line element 75b of the fifth line element group 75, a fifth line element 75e of the fifth line element group 75, a sixth line element 75f of the fifth line element group 75, a first line element 77a of the seventh line element group 77, a second line element. 77b of the seventh line element group 77, a fifth line element 77e of the seventh line element group 77, and a sixth line element 77f of the seventh line element group 77, in the order of connection looking from the side of the voltage input terminal (+V2).

There are connected in series eight line elements between the voltage input terminal (−V2) and the output terminal (B1). Between the voltage input terminal (−V2) and the output terminal (B1), there are connected a third line element 75c of the fifth line element group 75, a fourth line element 75d of the fifth line element group 75, a seventh line element 75g of the fifth line element group 75, an eighth line element 75h of the fifth line element group 75, a third line element 77c of the seventh line element group 77, a fourth line element 77d of the seventh line element group 77, a seventh line element 77g of the seventh line element group 77, and an eighth line element 77h of the seventh line element group 77, in the order of connection looking from the side of the voltage input terminal (−V2).

There are connected in series eight line elements between the voltage input terminal (+V3) and the output terminal (B2). Between the voltage input terminal (+V3) and the output terminal (B2), there are connected a first line element 76a of the sixth line element group 76, a second line element 76b of the sixth line element group 76, a fifth line element 76e of the sixth line element group 76, a sixth line element 76f of the sixth line element group 76, a first line element 78a of the eighth line element group 78, a second line element 78b of the eighth line element group 78, a fifth line element 78e of the eighth line element group 78, and a sixth line element 78f of the eighth line element group 78, in the order of connection looking from the side of the voltage input terminal (+V3).

There are connected in series eight line elements between the voltage input terminal (−V2) and the output terminal (B2). Between the voltage input terminal (−V2) and the output terminal (B2), there are connected a third line element 76c of the sixth line element group 76, a fourth line element 76d of the sixth line element group 76, a seventh line element 76g of the sixth line element group 76, an eighth line element 76h of the sixth line element group 76, a third line element 78c of the eighth line element group 78, a fourth line element 78d of the eighth line element group 78, a seventh line element 78g of the eighth line element group 78, and an eighth line element 78h of the eighth line element group 78, in the order of connection looking from the side of the voltage input terminal (−V2).

There are connected in series eight line elements between the voltage input terminal (+V4) and the output terminal (A2). Between the voltage input terminal (+V4) and the output terminal (A2), there are connected a first line element 72a of the second line element group 72, a second line element 72b of the second line element group 72, a fifth line element 72e of the second line element group 72, a sixth line element 72f of the second line element group 72, a first line element 74a of the fourth line element group 74, a second line element 74b of the fourth line element group 74, a fifth line element 74e of the fourth line element group 74, and a sixth line element 74f of the fourth line element group 74, in the order of connection looking from the side of the voltage input terminal (+V4).

There are connected in series eight line elements between the voltage input terminal (−V3) and the output terminal (A2). Between the voltage input terminal (−V3) and the output terminal (A2), there are connected a third line element 72c of the second line element group 72, a fourth line element 72d of the second line element group 72, a seventh line element 72g of the second line element group 72, an eighth line element 72h of the second line element group 72, a third line element 73c of the fourth line element group 74, a fourth line element 74d of the fourth line element group 74, a seventh line element 74g of the fourth line element group 74, and an eighth line element 74h of the fourth line element group 74, in the order of connection looking from the side of the voltage input terminal (−V3).

In the MR sensor for scale signals 50, the respective line elements, voltage input terminals and the voltage output terminals are interconnected as described above to constitute a bridge circuit.

Figure 25:
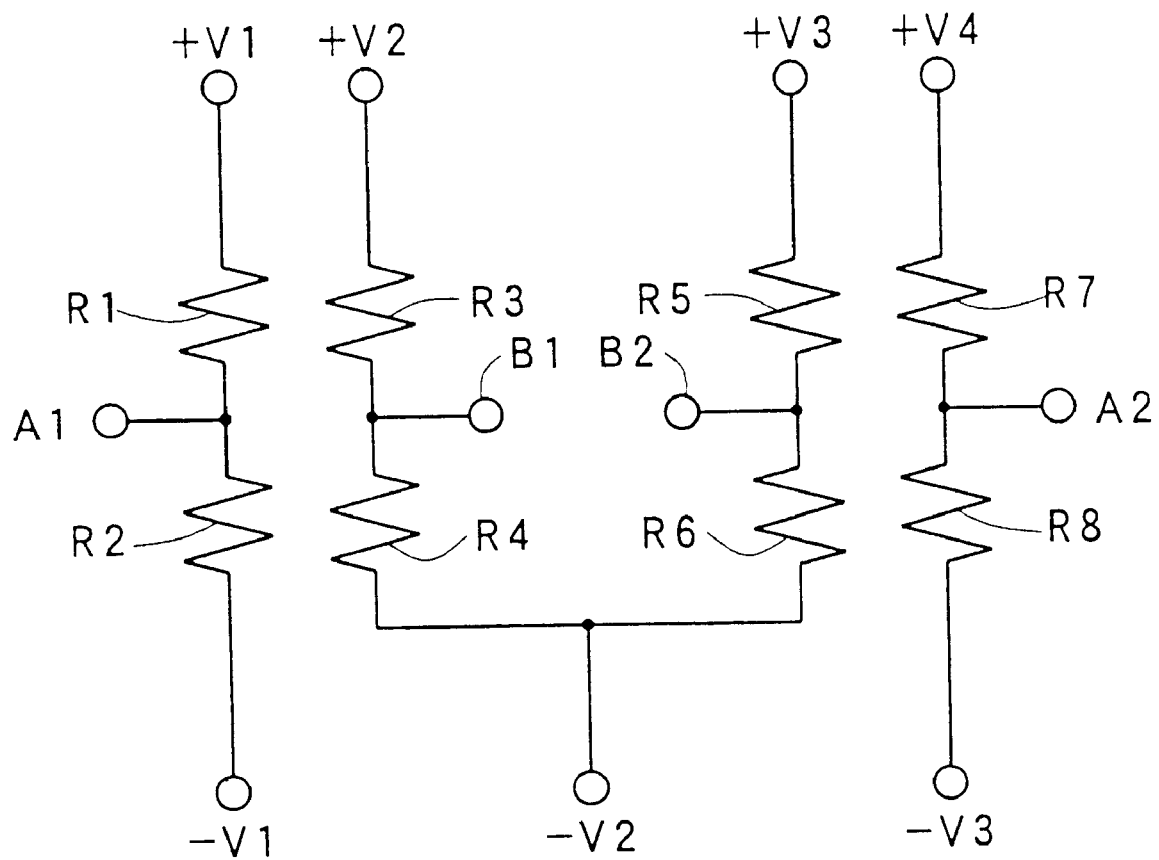
FIG. 25 is an equivalent circuit diagram of the MR sensor for scale signals.

It is assumed that the resistance of the line element connected in series between the voltage input terminal (+V1) and the output terminal (A1) is R1, that of the line element connected in series between the voltage input terminal (−V1) and the output terminal (A1) is R2, that of the line element connected in series between the voltage input terminal (+V2) and the output terminal (B1) is R3, that of the line element connected in series between the voltage input terminal (−V2) and the output terminal (B1) is R4, that of the line element connected in series between the voltage input terminal (+V3) and the output terminal (B2) is R5, that of the line element connected in series between the voltage input terminal (−V2) and the output terminal (B2) is R6, that of the line element connected in series between the voltage input terminal (+V4) and the output terminal (A2) is R7, and that of the line element connected in series between the voltage input terminal (−V3) and the output terminal (A2) is R8. In this case, the bridge circuit constituted on the MR sensor for scale signals 50 is shown in FIG. 25.

In the above-described bridge circuit, there are produced substantially sinusoidal electrical signals of a wavelength about one-half the recording pitch $\lambda_1$ (detection pitch $P_1$) changing about the intermediate voltage between the voltage input terminal (+V1) and the voltage input terminal (−V1).

Also, if the output signal of the output terminal A1 is $A\sin\theta$, $A\cos\theta$ is outputted from the output terminal A2, while $-A\sin\theta$ and $-A\cos\theta$ are outputted from the output terminals B1 and B2, respectively.

Figure 26:
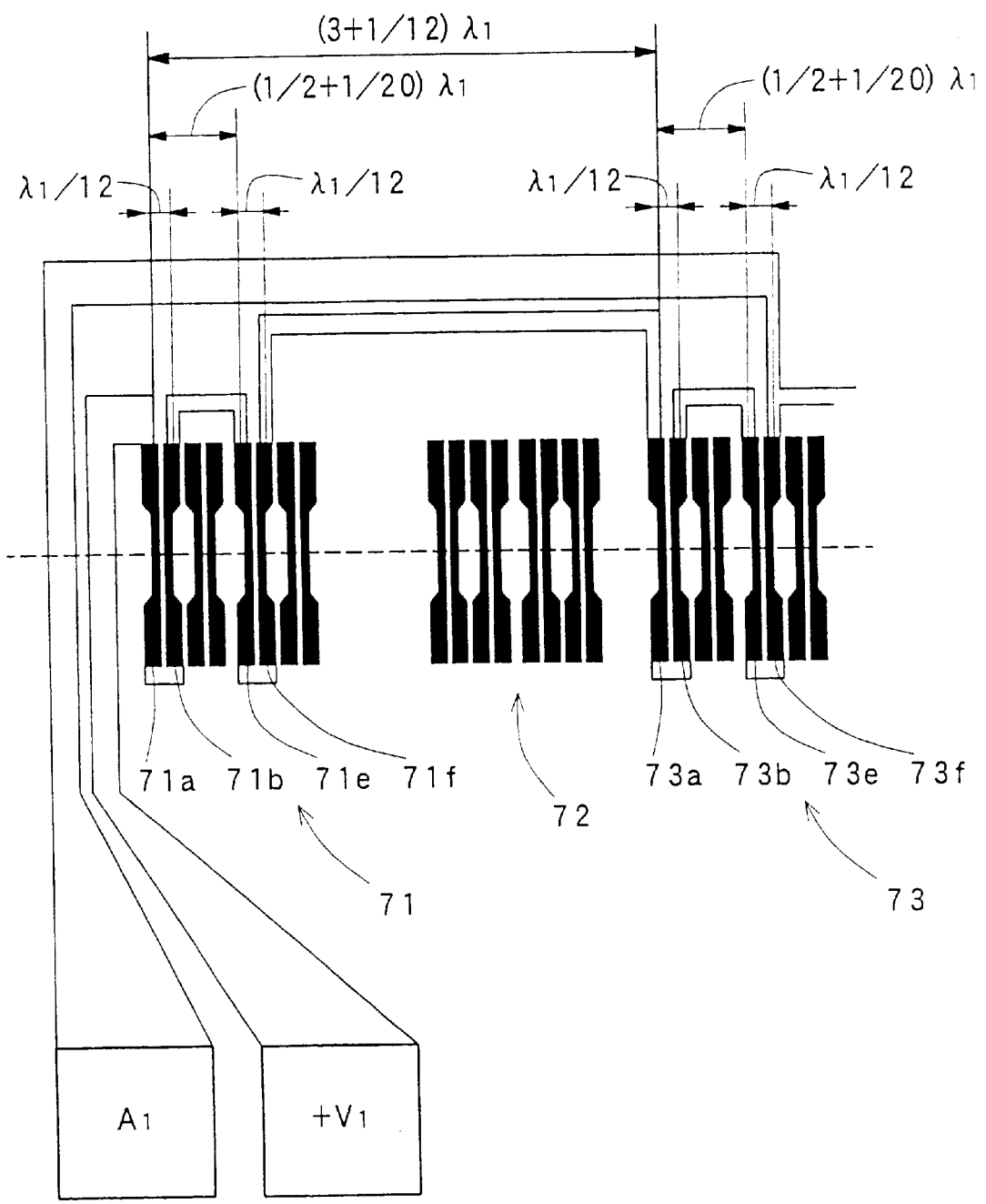
FIG. 26 illustrates a pattern of line elements interconnected between voltage input and output terminals and interconnection thereof.

FIG. 26 shows a pattern and the interconnection of line elements interconnected between the voltage input terminal V1 and the output terminal A1.

Referring to FIG. 26, the center-to-center distance between the first line element 71a of the first line element group 71 and the second line element 71b of the first line element group 71 is $\lambda_1/12$. The center-to-center distance between the fifth line element 71e and the sixth line element 71f of the first line element group 71, that between the first line element 73a and the second line element 73b of the third line element group 73 and that between the fifth line element 73e and the sixth line element 73f of the third line element group 73 are similarly $\lambda_1/12$. This $\lambda_1/12$ is equivalent to P/6 and ⅙ wavelength in terms of an output signal and phase, respectively. By the phase of the output signal being offset in this manner by ⅙ wavelength, the line element between the voltage input terminal V1 and the output terminal A1 diminishes resistance changes for the third harmonics in the resistance value changed at a one-half wavelength of the recording pitch $\lambda$. Thus, signals of the third harmonics of the output signal of the output terminal A1 (having a wavelength equal to one-half the recording pitch $\lambda_1$) can be reduced. The above distance is not limited to $\lambda_1/12$ and may also be $(n/2\pm\frac{1}{12})\lambda_1$.

The center-to-center distance between the paired first and second line elements 71a, 71b of the first line element group 71 and the paired fifth and sixth line elements 71e and 71f of the first line element 71 is $(\frac{1}{2}+\frac{1}{20})\lambda_1$. The center-to-center distance between the paired first and second line elements 73a, 73b of the third line element group 73 and the paired fifth and sixth line elements 73e and 73f of the third line element group 73 is $(\frac{1}{2}+\frac{1}{20})\lambda_1$. By the phase shift corresponding to ¹/₂₀th of a wavelength, the line elements between the voltage input terminal V1 and the output terminal A1 diminish changes in resistance for the fifth harmonics in the resistance value changed at a wavelength equal to one-half the wavelength of the recording pitch $\lambda_1$. Thus, signals of the fifth harmonics of the output signal of the output terminal A1 (with a wavelength equal to one-half the recording pitch $\lambda_1$, that is the detection pitch $P_1$) can be reduced. The above distance is not limited to $(\frac{1}{2}+\frac{1}{20})\lambda_1$, and may also be $(n/2\pm\frac{1}{20})\lambda_1$.

On the magnetic scale 37, alternate N and S poles as periodic scale signals are magnetized along its length. If there are any effects other than those ascribable to scale signals, as when small-sized magnetized portions caused by dc magnetization are present on the entire scale or on a portion of the scale along the length thereof, the direction of anisotropy of the MR sensor for scale signals 50 is not parallel to the length of the line elements but is tilted at a small angle, or if the MR sensor for scale signals 50 experiences the magnetization from outside intersecting the line elements at an angle other than a right angle, the sole line element undergoes changes in resistance of a wavelength at the recording pitch $\lambda 1$ in addition to the change in resistance of the wavelength equal to one-half the recording pitch. However, the line elements between the voltage input terminal V1 and the output terminal A1 additively cancel resistance changes of the wavelength of the recording pitch $\lambda_1$ caused by one or more of the above factors by the wavelength shift of $\lambda\frac{1}{2}$ of the respective line elements. The above distance is not limited to $\lambda\frac{1}{2}$ and may also be $((2n+1)/2)\lambda_1$. For reducing the signals of the wavelength of the recording pitch $\lambda_1$, it is necessary to provide a set having the phase difference of $(2n+1)\lambda_1/2$ so that the sum of the line elements will always be an even number.

The center-to-center distance between the first line element group 71 and the third line element group 73 is $(3+\frac{1}{12})\lambda_1$. If the phase is offset by ¹/₁₂th of a wavelength, the line elements between the voltage input terminal V1 and the output terminal A1 reduce changes in the resistance for the third harmonics in the resistance value changing with one-half of the wavelength of the recording pitch $\lambda_1$. Therefore, signals of third harmonics in the output signal of the output terminal A1 (having a wavelength equal to one-half the recording pitch $\lambda_1$ or detection pitch $P_1$) can be diminished. This distance is not limited to $(3+\frac{1}{12})\lambda_1$ and may also be $(n/2\pm\frac{1}{12})\lambda_1$.

Thus, by the pattern of line elements connected between the voltage input terminal V1 and the output terminal A1, the output signal of the output terminal A1 can diminish third and fifth harmonics, while it can cancel the signal of the pitch of the wavelength $\lambda_1$. In particular, the third harmonics are further reduced by dual repetition of the pattern with a phase shift of ¹/₁₂th of a wavelength.

Although an example of the pattern of line elements interconnected between the voltage input terminal V1 and the output terminal A1 has been shown in the foregoing, the patterns of line elements between other terminals is the same and hence is not explained specifically. By the above construction of the bridge circuit, distortions due to even harmonics cancel each other and are thereby reduced.

With the above-described MR sensor for scale signals 50, having the line elements, the relative position between it and the magnetic scale 37 can be converted into electrical signals which are outputted. In particular, the MR sensor for scale signals 50 can output sine wave signals having only little harmonic distortions. The result is that interpolation of the detection pitch $P_1$ (one-half the recording pitch $\lambda_1$) can be effected correctly to realize position detection with high resolution.

The structure of the MR sensor for point-of-origin signals 51 will be explained in further detail.

Figure 27:
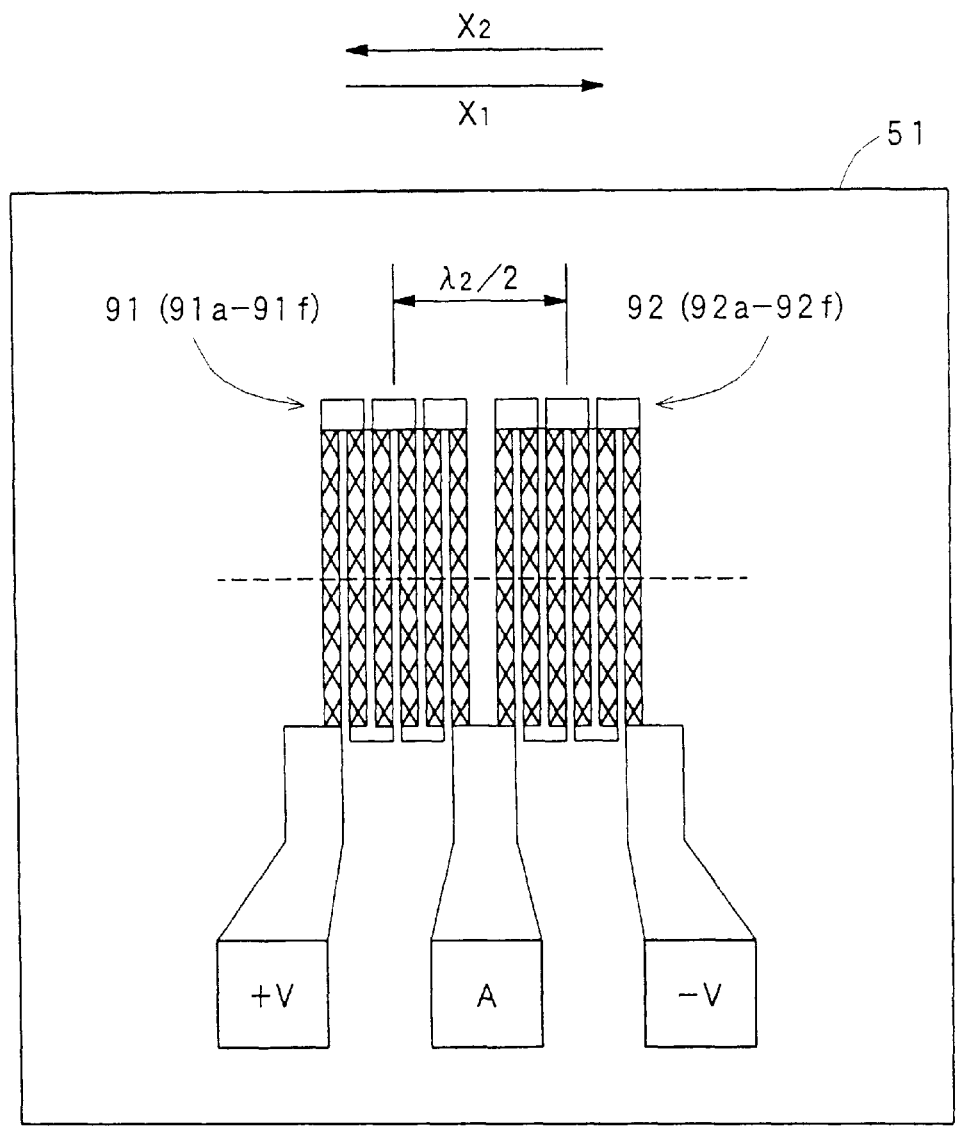
FIG. 27 illustrates a pattern of groups of line elements, line elements and electrodes formed on a substrate of the MR sensor for a point-of-origin signals.
Figure 28:
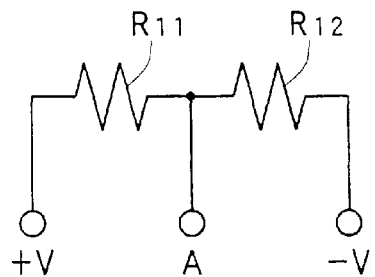
FIG. 28 is an equivalent circuit diagram of the MR sensor for a point-of-origin signals.

FIGS. 27 and 28 show a pattern of line elements formed on the substrate of the MR sensor for point-of-origin signals 51 and a equivalent circuit diagram of t the MR sensor for point-of-origin signals 51, respectively.

On the MR sensor for point-of-origin signals 51, a film of a ferromagnetic material, such as Fe—Ni or Ni—Co, is formed on a substrate of a non-magnetic material, such as glass, for forming 12 line elements displaying a magneto-resistive effect. These 12 line elements are all formed so that the longitudinal direction of these line elements is at right angle with the direction of relative movement with respect to the magnetic scale 37. The current flows along this longitudinal direction. These 12 line elements are arranged side-by-side in the direction of relative movement with respect to the magnetic scale 37 (the direction indicated by arrows X1 and X2 in FIG. 27) and are formed in this arraying state on the substrate.

The 12 line elements formed on the MR sensor for point-of-origin signals 51 are split into a first line element group 91 made up of six line elements (line elements 91a to 91f) and a second line element group 92 made up of six line elements (line elements 92a to 92f).

The first line element group 91 and the second line element group 92 are formed at a separation of $\lambda_2/2$ from each other, where $\lambda_2$ represents the recording pitch of the point-of-origin signals recorded on the magnetic scale 37.

On the substrate of the MR sensor for point-of-origin signals 51 are formed connection terminals for accepting the voltage from outside and for furnishing the detected scale signals to outside.

On the substrate of the MR sensor for point-of-origin signals 51 are formed the voltage input terminal (+V), voltage input terminal (−V) and the output terminal (A), as shown in FIG. 27. For example, a voltage of +5V and the ground voltage are applied to the voltage input terminal (+V) and to the voltage input terminal (−V), respectively.

Between the voltage input terminal (+V) and the output terminal (A), there are connected in series the line elements 91*a* to 91*f* of the first line element group 91. Between the voltage input terminal (−V) and the output terminal (A), there are connected in series the line elements 92*a* to 92*f* of the first line element group 92.

In the MR sensor for point-of-origin signals 51, the line elements and the voltage input and output terminals are interconnected to constitute a bridge circuit. If a resistance of the line elements connected in series between the voltage input terminal (+V) and the output terminal (A) and a resistance of the line elements connected in series between the voltage input terminal (−V) and the output terminal (A) are denoted as R11 and R12, respectively, the bridge circuit constituted on the MR sensor for point-of-origin signals 51 is shown in FIG. 28.

With the above-described bridge circuit, it is possible to obtain an electrical signal of a wavelength equal to one-half the recording pitch $\lambda_2$ changed about a voltage intermediate between the voltage input terminal (+V) and the voltage input terminal (−V) as center. This electrical signal is obtained on passing through the point-of-origin signals.

With the position detection device 30 of the second embodiment, a sufficient output with an optimum output can be developed even if the magnetized surface of the magnetic scale 37 carrying the position signals are curved. Also, with the position detection device 30, the distance between the magnetic scale 37 and the MR sensor for scale signals 50 can be kept at a larger value to assure facilitated assemblage and improved reliability.

Moreover, with the position detection device 30, in which the MR sensor for scale signals 50 and the MR sensor for point-of-origin signals 51 are arranged as described above, crosstalk can be suppressed, such that optimum scale signals and point-of-origin signals can be produced.

Although description has been made of the position detection device 1 and the position detection device 30 for detecting an object performing a linear movement as first and second embodiments, the present invention is not limited thereto and may, for example, be designed as a position detection device for detecting the rotating position of a rotating object.

In addition, although description has been made of the magneto-resistive effect sensor (MR sensor) 3 and the MR sensor for scale signals 50 in which the magnetic field is applied from the round-rod-shaped magnetic scale 2 or the magnetic scale 37, the magnetized material applying the magnetic field to the magneto-resistive effect sensor of the present invention may be any other suitable magnetized material provided that it can apply a signal magnetic field of different strengths along the direction of the flowing current.

The present invention also can be modified in other respects within the scope of the invention specified in the claims.

What is claimed is:

1. A position detection device, comprising:

a magnetized material having a signal magnetic field affording position information recorded thereon; and a magneto-resistive effect sensor arranged for relative movement with respect to a recording direction of the signal magnetic field recorded along a longitudinal axis of said magnetized material, wherein said magneto-resistive effect sensor has a magnetically sensitive area for receiving from said magnetized material said signal magnetic field formed of various magnitudes transverse to said longitudinal axis along a lengthwise current flowing direction of said magnetically sensitive area of, the magnetically sensitive area of said magneto-resistive effect sensor having in a direction perpendicular to said current flowing direction a set predetermined varying width that varies according to the various magnitudes of said signal magnetic field, and a direction of said relative movement of said magneto-resistive effect sensor with respect to said magnetized material is perpendicular to said lengthwise current flowing direction and parallel to said longitudinal axis of said magnetized material.

2. The position detection device according to claim 1, wherein said magnetized material is a rod-shaped scale having said signal magnetic field recorded thereon along a length thereof, and the magnetically sensitive area of said magneto-resistive effect sensor has respective ends wider than a middle portion thereof.

3. The position detection device according to claim 2, further comprising a bias magnet for generating a magnetic field in a direction parallel to said lengthwise current flowing direction in said magnetically sensitive area, wherein said bias magnet is arranged facing said rod-shaped scale with said magneto-resistive sensor placed between said bias magnet and said rod-shaped scale.

4. The position detecting device according to claim 1, wherein the position information is recorded with a recording pitch $\lambda$ on said magnetized material, said magnetically sensitive area of said magneto-resistive effect sensor is formed of a plurality of magnetically sensitive areas arranged in said direction of said relative movement with respect to said magnetized material, each of said plurality of magnetically sensitive areas has connected in series another magnetically sensitive area spaced by a distance of $\{n/2-/+1/12\}\lambda$, n=0, 1, 2, 3 . . . , to form a first pair of magnetically sensitive areas, said first pair of magnetically sensitive areas having a second pair of magnetically sensitive areas spaced apart from said first pair of magnetically sensitive areas by a distance of $\{m/2-/+1/12\}\lambda$, m=0, 1, 2, 3 . . . , and said four magnetically sensitive areas of said first and second pairs of magnetically sensitive areas being connected to each other in series.

5. The position detection device according to claim 4, wherein said magnetized material is a rod-shaped scale having said signal magnetic field recorded thereon along a length thereof, and the magnetically sensitive area of said magneto-resistive sensor has respective ends wider than a middle portion thereof.

* * * * *